United States Patent [19]

Brody

[11] 4,051,465
[45] Sept. 27, 1977

[54] FERROELECTRIC CERAMIC DEVICES

[75] Inventor: Philip S. Brody, Brookmont, Md.

[73] Assignee: The United States of America as represented by the Secretary of the Army, Washington, D.C.

[21] Appl. No.: 533,365

[22] Filed: Dec. 16, 1974

Related U.S. Application Data

[63] Continuation-in-part of Ser. No. 411,853, Nov. 1, 1973.

[51] Int. Cl.$^2$ ............................................. G11C 11/42
[52] U.S. Cl. ........................... 340/173.2; 340/173 LS; 340/173 LM; 340/324 M; 358/236
[58] Field of Search ....... 340/173.2, 173 LM, 173 LS

[56] References Cited

U.S. PATENT DOCUMENTS

| | | | |
|---|---|---|---|
| 3,693,171 | 9/1972 | Asam | 340/173.2 |
| 3,703,331 | 11/1972 | Goldmacher | 340/173.2 |
| 3,740,734 | 6/1973 | Maldonado | 340/173.2 |

Primary Examiner—Terrell W. Fears
Attorney, Agent, or Firm—Nathan Edelberg; Robert P. Gibson; Saul Elbaum

[57] ABSTRACT

A method and apparatus is disclosed by which high voltage and current can be produced by a polycrystalline ferroelectric ceramic material in response to incident light. Numerous applications of the ferroelectric ceramic material taking advantage of such properties thereof are further disclosed. The polycrystalline ferroelectric ceramic material is initially poled by the application thereto of a pulse of voltage of predetermined magnitude and direction. After being poled in such fashion, the application of light impinging on the various surfaces of the ferroelectric ceramic material will induce a consistant high voltage between select surfaces of the ferroelectric ceramic material. Upon disposing electrodes in conductive contact with the material, a current can be generated to a load attached thereacross. Importantly, the magnitude of the voltage produced upon the application of incident light is directly proportional to the remanent polarization of the ferroelectric ceramic material, and is further directly proportional to the length of the material, the polarity of the high voltage being dependent upon the polarity of the remanent polarization and being capable of being reversed when the remanent polarization is reversed. The open circuit voltages produced by the ferroelectric ceramic material are orders of magnitude higher than those which typically have been produced in the prior-art through the utilization of standard photovoltaic materials.

25 Claims, 34 Drawing Figures

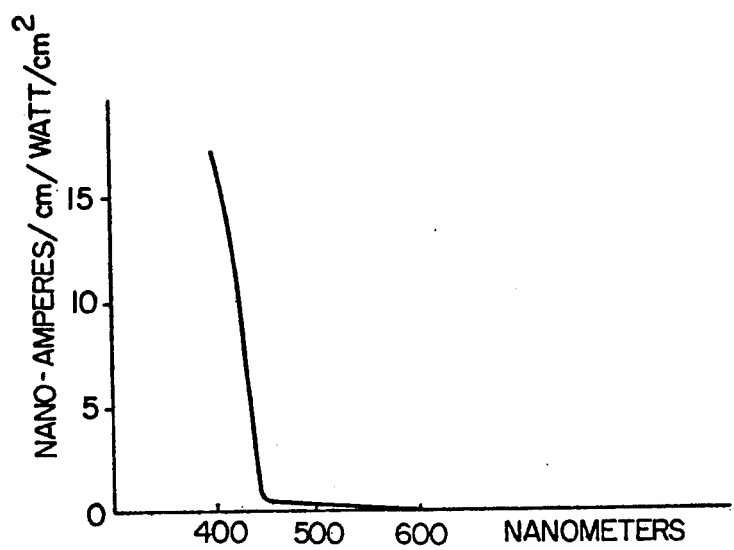
FIG. 12
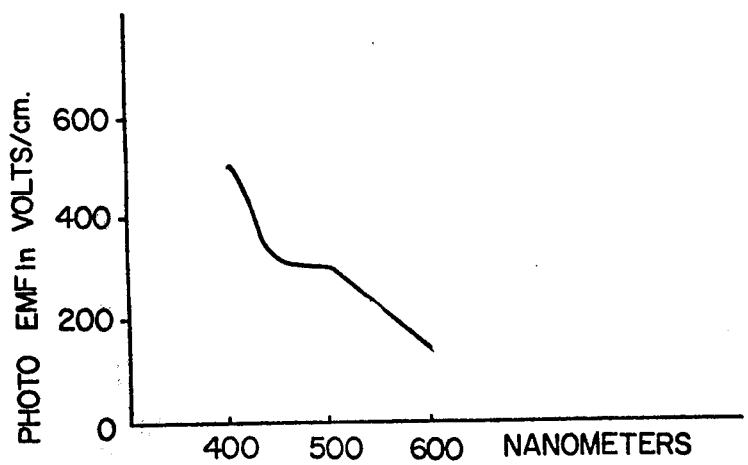
FIG. 13
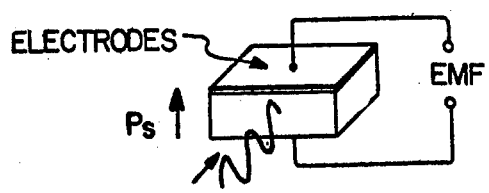

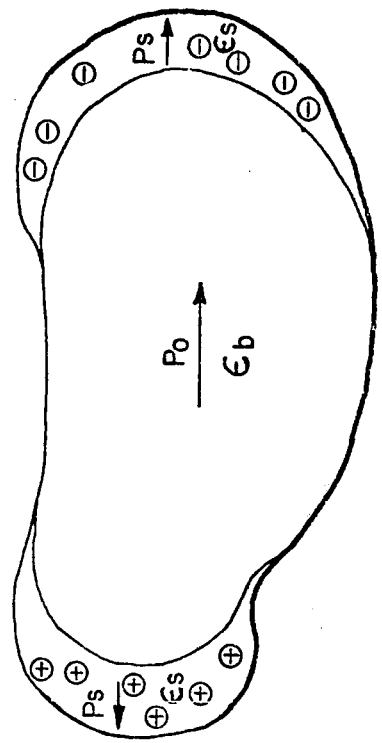
FIG. 21
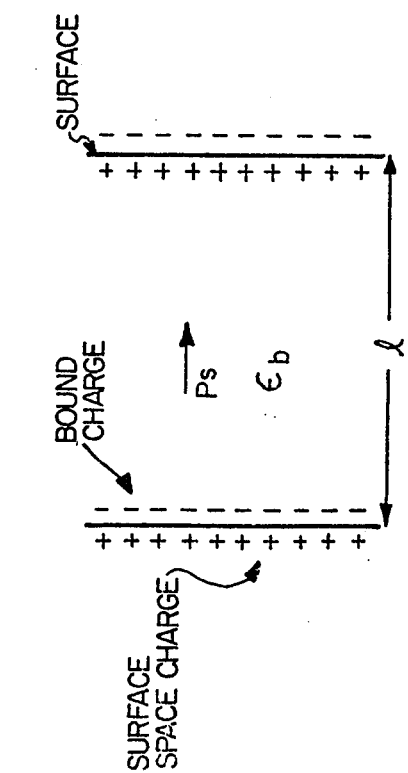
FIG. 23
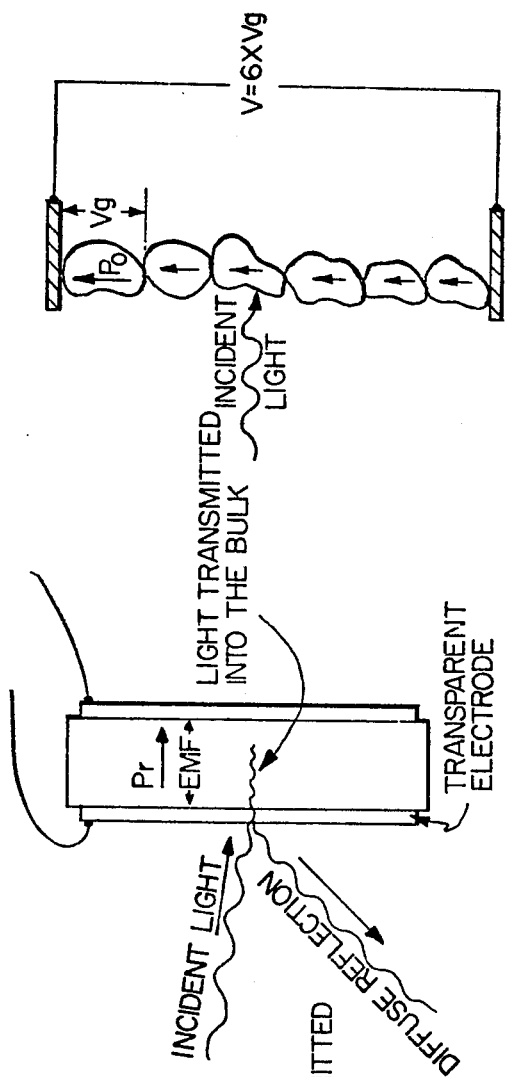
FIG. 20
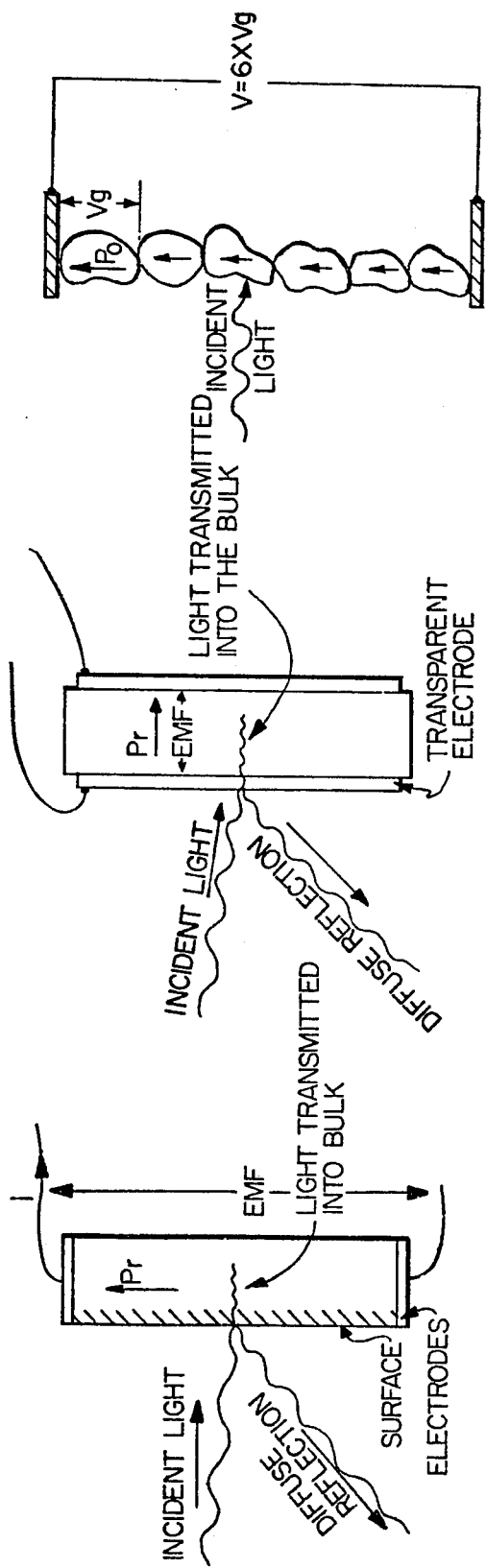
FIG. 19
FIG. 22

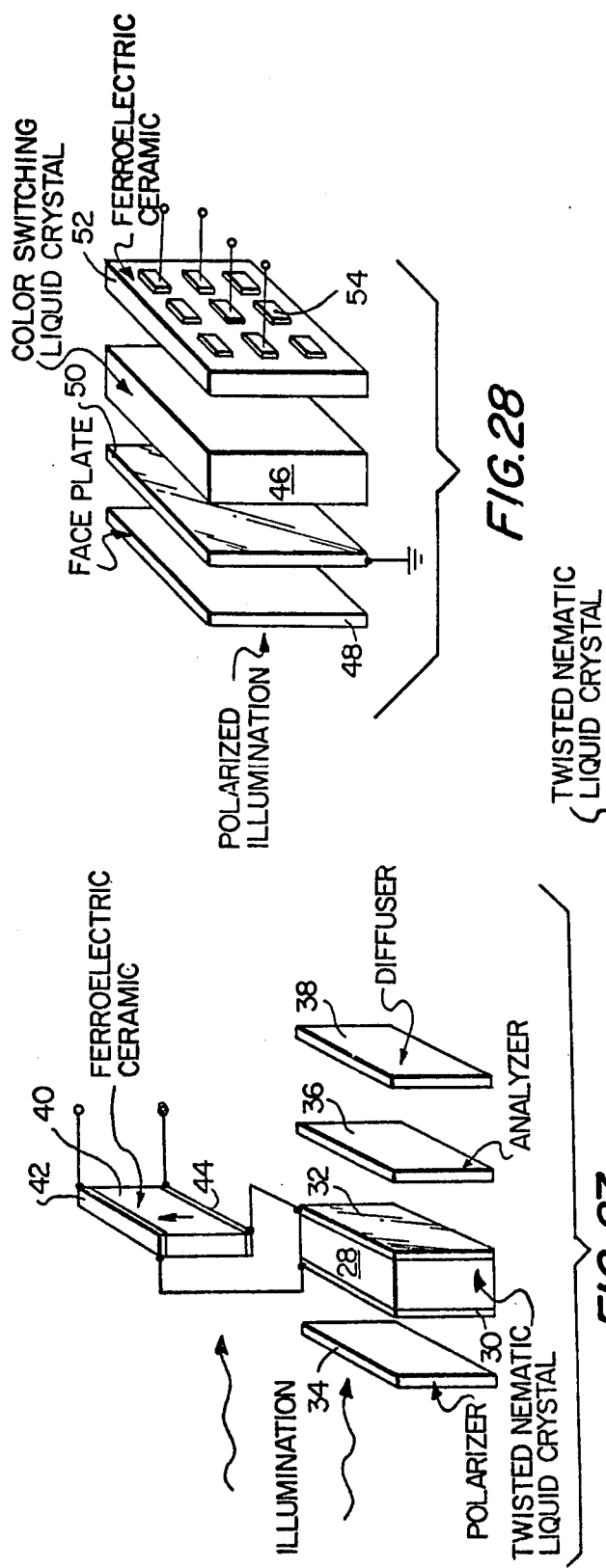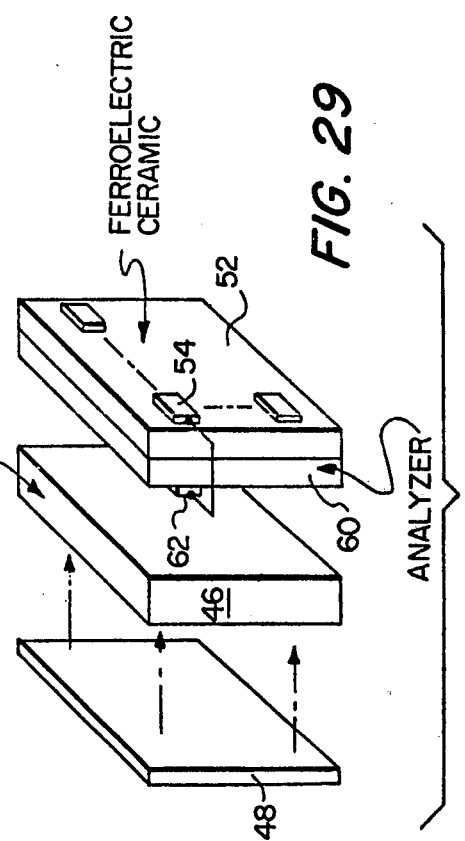

FERROELECTRIC CERAMIC DEVICES

RIGHTS OF THE GOVERNMENT

The invention described herein may be manufactured, used and licensed by or for the United States Government for governmental purposes without the payment to the inventor of any royalties thereon.

RELATED CASES

This application is a continuation-in-part of prior Application Ser. No. 411,853 filed Nov. 1, 1973. The disclosure in such prior application is incorporated by reference thereto herein.

BACKGROUND OF THE INVENTION

This invention generally relates to solid state devices exhibiting photovoltaic effects and is particularly directed to the provision of a device consisting of a class of polycrystalline ferroelectric ceramic materials which have been discovered to produce voltages upon the application of incident light thereto, such voltages having values many orders of magnitude higher than voltages typically produced by conventional photovoltaic materials.

Initially, and as background, the instant inventive apparatus and techniques to be discussed hereinbelow are to be clearly distinguished from the photovoltaic effect now know in the prior-art in that the mechanism for the effect to be discussed herein appears to be unique and different from photovoltaic mechanisms previously described.

SUMMARY OF THE INVENTION

It is the primary objective of the instant invention to provide a device and technique by which extremely high voltage can be generated utilizing a solid state polycrystalline class of materials upon the application to such materials of incident light, the voltage generated exhibiting properties entirely unlike the well-known photovoltaic effect of the prior art and of orders of magnitude higher than voltages previously obtainable.

Another equally important objective of the instant invention is the provision of apparatus utilizing ferroelectric ceramic materials of the type to be described hereinbelow, such apparatus taking advantage of the unique properties as discovered to be existent in the class of materials to which the instant invention relates.

These broad objectives, as well as others which will become apparent as the following description proceeds, are implemented by the subject invention which utilizes at its heart a class of materials known as ferroelectric ceramics, and which take advantage of the unique photovoltaic properties discovered to be existent in such class of materials.

Specifically, by illuminating the surfaces of these materials, a steady voltage results across conducting electrodes placed in contact therewith. Currents can then be drawn through loads placed across these electrodes. It has been discovered that an arrangement of an initially polarized ceramic material with electrodes attached thereto as is shown in FIG. 1 of the application drawings produces steady high voltages from a steady illuminating source such as the sun, an incandescent bulb, a fluorescent tube, etc. and that the magnitude of these voltages is high and directly proportional to the length, l of the sheet of material provided. In FIG. 1, the shaded area represents an electrode, and $P_r$ is the remanent polarization. In another basic arrangement of the invention, light enters through transparent electrodes and the material is poled in the direction of the light, and the photoemf up to a certain limiting thickness is proportional to the thickness of the slab.

It has further been discovered that the magnitude of the photovoltages produced is directly proportional to the remanent polarization of the material. The polarity of the photovoltage is dependent on the polarity of the remanent polarization and reverses when the remanent polarization is reversed. The magnitude of the voltages that are produced can also be varied by varying the sizes of the grains of which the ceramic is composed, the voltage having a generally proportional relation to the number of grains per unit length. Grain size can be controlled by well-known fabrication techniques involving compositional additives and firing rates, which techniques do not form a part of the present disclosure.

When illuminated at intensity levels such as that produced by direct sunlight or at lesser levels such as that produced by a flourescent lamp, the materials will behave as voltage sources in series with a high output resistance. The output resistance will decrease an the intensity of illumination increases and also varies with wavelength.

The open circuit voltages produced by the materials of the invention are much higher than those that are typical of other photovoltaic materials. These high open circuit photovoltages have been observed to some extent in virtually all materials examined which can generally be described or classified by the term ferroelectric ceramic, provided that the material was characterized by a net remanent polarization. Such high photovoltages are to be expected in virtually all polarized ferroelectric ceramic materials properly doped, the class including thousands of different known materials of this kind with numerous variations possible in each kind. Such variations are produced by additives, varying grain size, and by changing compositional blends, in those formed from mixtures. Any of these are expected to have application as photovoltaic materials.

From the viewpoint of application, the novel photovoltaic effect seen in ferroelectrics in accordance with the teachings herein differs in two important respects from the well known junction photovoltaic effect which is the mechanism in prior-art devices such as solar cells, and photodiodes.

First, the prior-art junction photo-emf is independent of the length or thickness of the unit and is low, less than one volt. To obtain high voltages, many cells have to be connected in series. The photovoltaic effect in ferroelectrics, on the other hand, can be used to directly produce high voltages. The photo-emf is proportional to length, and the photo-emf per unit length can be very high. For example, the composition $Pb(Zr_{.65}Ti_{.35})O_3$ with 7% of the lead substituted by lanthanum, when composed of 2–4 microns grains produces, when illuminated as shown in FIG. 1, 1500 volts for every centimeter of length between the electrodes. A single one cm square unit thus directly produces 1500 volts.

In this case, it is also clear that the voltage per unit length will be further increased by the development of a composition in which the average grain size is further decreased.

These voltages are so high that applications have been contemplated which are alternatives to the devices presently used for the generation of extremely high DC voltages at low currents — such as belt machines (the Van de Graaf), in which high voltages are produced by mechanically moving electric charges.

Second, and perhaps even more important, is the fact that the direction of the photocurrent and photovoltage can be reversed simply by reversing the direction of its remanent polarization. The magnitude of these quantities can be changed by changing that of the remanent polarization, which in turn can be done (for example) by applying the proper polarity electrical voltage (poling voltage) to the same terminals across which the photovoltages appear. The reversibility and control provided make immediately possible applications to use in computer memories of a new type — in which information is stored as remanent polarization and read out as the polarity and magnitude of a photocurrent or photo-emf, such typical applications being disclosed herein.

Application to the generation of electrical power from solar radiation, for example, to solar battery type devices and to electrical power generating stations operating on the basis of solar to electrical energy conversion also is possible and contemplated but would require, to be practical, (except in special cases) considerably larger conversion efficiency than has been observed so far in the materials examined. A calculation of theoretical maximum efficiency, however, yields results which are large enough to suggest eventual practical use in this manner. A conversion system based on these high voltage materials would have the particular advantage of producing its electricity directly at high voltage which is advantageous for power transmission purposes.

The mechanism for the discovered effect appears to be unique and different from photovoltaic mechanisms previously described. Description will be provided hereinbelow explaining the mechanism and developing a theory therefor. From this, it will be clear that the entire class of polycrystalline ferroelectrics are expected to exhibit high photo-emf's to at least some extent.

BRIEF DESCRIPTION OF THE DRAWINGS

The invention itself will be better understood and further features and advantages thereof will become apparent from the following detailed description thereof, such description making reference to the appended sheets of drawings, wherein:

FIG. 12 is a diagram illustrating the photocurrent divided by intensity vs. cut-off wave length of short wave length cut-off filters, with the material being Pb $(Zr_{.53}Ti_{.47})O_3$ with 1% by weight of $Nb_2O_5$ added;

FIG. 13, is diagram illustrating the photo-emf vs. wave length of short wave length cut-off filters, with the material being Pb $(Zr_{.53}Ti_{.47})O_3$ with 1% by weight of $Nb_2O_5$ added;

FIG. 14 is a pictorial illustration of the manner in which a single crystal produces a photo-emf, with the polarization $P_s$ being normal to the electrodes, which electrodes are illustrated by the shaded area;

FIG. 19 is a cross-sectional, elevational view schematically depicting the ceramic slab of FIG. 1, with the photo-emf appearing across the electrodes on the edge, and with most of the photocurrent flow being found in the shaded region near the surface;

FIG. 20 is a cross-sectional, elevational view of a slab of ferroelectric ceramic material utilizing transparent electrodes and depicting light incident through the transparent electrodes into the slab with the slab being polarized in the thickness direction;

FIG. 21 is a cross-sectional diagramatic illustration of a single layer of grains depicting the manner in which photo-emf's are produced across the grains in an additive fashion to produce a length dependent effect in the ceramic material, the illumination being incident from the left-hand portion of the drawing and being typically quickly absorbed as it penetrates the material;

FIG. 22 is a diagram ilustrating idealized two dimensional crystals of length l with spontaneous polarization $P_s$, dielectric constant $\epsilon_b$ compensating surface charge per unit area of $\sigma = P_s$;

FIG. 23 is an illustration depicting the structure of a typical ferroelectric grain or crystallite;

FIG. 27 is a schematic illustration of an optical display apparatus utilizing a ferroeletric ceramic material in accordance with the general teachings of the instant invention;

FIG. 28 is a schematic illustration depicting an optical display apparatus constructed in accordance with the teachings of the instant invention in monolithic form utilizing a color switching liquid crystal;

FIG. 29 is a schematic illustration of the display apparatus of FIG. 28, modified to make utilization of a twisted nematic liquid crystal;

DETAILED DESCRIPTION OF THE PREFERRED INVENTIVE EMBODIMENTS

Figure 1:
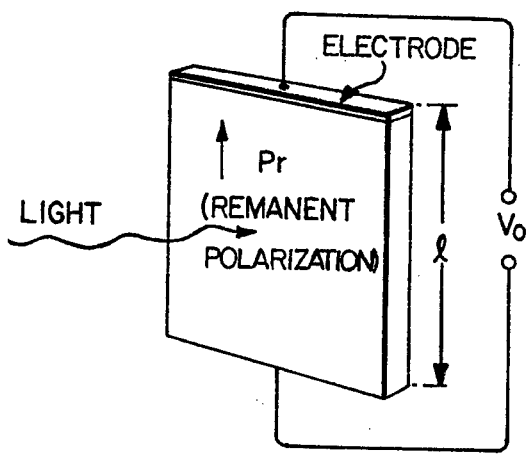
FIG. 1 is a schematic diagram illustrating the basic arrangement by which photovoltaic voltages are generated upon the application of incident light to a ferroelectric ceramic material in accordance with the teachings of the instant invention.

With reference now initially to FIG. 1 of the application drawings, a discussion of the novel phenomena of the instant invention will ensue. Upon the application of incident illumination to the ferroelectric ceramic, a steady voltage is produced which is proportional to the length l between the electrodes. By dividing the sample into two equal segments along a line perpendicular to the direction of the remanent polarization and by placing new electrodes on the cut edges, new samples would result each producing photo-emf's which is one half the original photo-emf.

Figure 2:
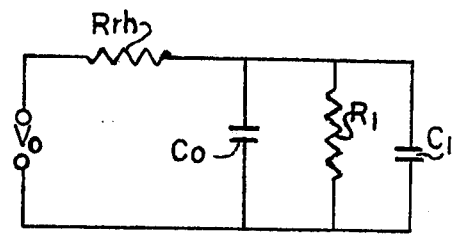
FIG. 2 is an electrical schematic diagram depicting an equivalent circuit to the basic apparatus of FIG. 1, wherein $C_0$ is the capacitance of the sample measured utilizing a capacitance meter connected between the electrodes and $C_1$ is the parallel capacitance of a load coupled to the electrodes, and $R_1$ is the resistive value of such load.
Figure 3:
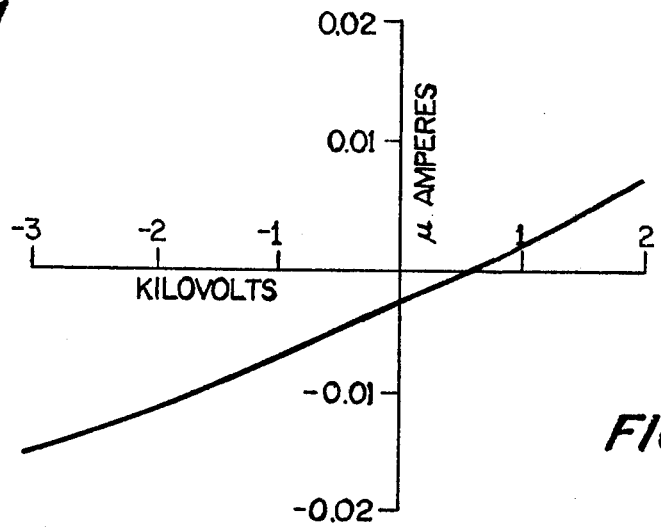
FIG. 3 is a graphical illustration of current vs. applied voltage to an illuminated ferroelectric wafer of the basic form depicted in FIG. 1.
Figure 4:
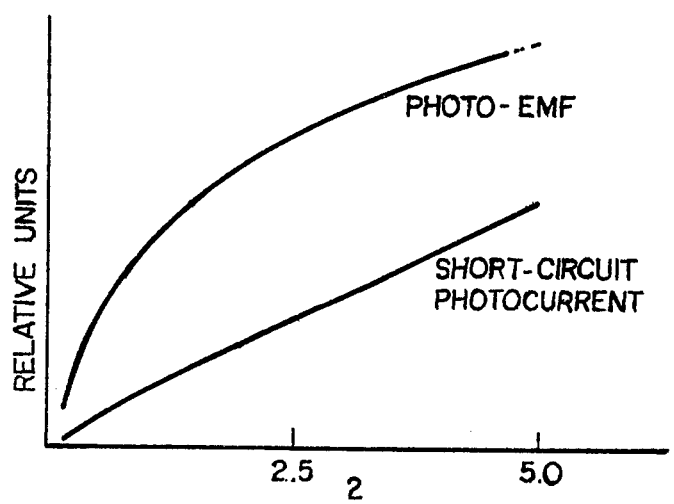
FIG. 4 is a graphical illustration of the photo-emf and photocurrent as a function of intensity of illumination, with the particular graphical results being for a solid solution Pb $(Zr_{.53}Ti_{.47})O_3$ with about 1% $Nb_2O_5$ by weight added.

An arrangement such as that shown in FIG. 1 can be described roughly by the equivalent circuit as shown in FIG. 2. This has a saturation photo-emf $V_o$, in series with the photo resistance of the illuminated sample. FIG. 3 is a current-voltage characteristic of a typical illuminated ferroelectric slab, and has the form expected from the equivalent circuit in FIG. 2 except for the slight tendency towards saturation in the lower left quadrent. As a function of intensity, the photo-emf saturates at relatively low levels of illumination. The short circuit photocurrent is, however, linear with light intensity. Results for the material $Pb(Zr_{.53}Ti_{.47})O_3$ with 1 wt% $Nb_2O_5$ are shown in FIG. 4. The implication of these results and the equivalent circuit in FIG. 2 is that the photoresistance $R_{ph}$ is inversely proportional to intensity.

A saturation photo-emf and a short circuit current proportional to intensity has been measured in several poled ferroelectric materials. These are shown in Table I.

Table I

Photovoltaic outputs at room temperature for several ceramic compositions. The wafers were fully poled, to their maximum remanent polarization. Filtered illumination had a half bandwidth of about 10 nm. The photo-emf is a saturation value reached at relatively low value of intensity.

| Sample | Illumination Wave length (nm) | Saturation Photo-emf (Volts/cm) | Short Circuit Photocurrent ($\mu Amperes/cm \over watts/cm^2$) |
|---|---|---|---|
| $Pb(Zr_{.53}Ti_{.47})O_3$ +1 wt% $Nb_2O_5$ | 373 | 610 | .31 |
| $BaTiO_3$ + 5 wt% $CaTiO_3$ | 403 | 360 | .020 |
| $Pb(Zr_{.65}Ti_{.35})O_3$ with 7% lanthanum-lead substitution | 382 | 1500 | .030 |
| $Pb(Zr_{.65}Ti_{.35})O_3$ with 8% lanthanum-lead substitution | 382 | 750 | .015 |
| $BaTiO_3$ + 5wt% $CaTiO_3$ | 403 | 355 | .02 |
| $Pb(Zr_{.53}Ti_{.47})O_3$ + 1wt% $Nb_2O_3$ with polished surfaces | 382 | 610 | ~.61 |

For a given composition the photo-emf is also a function of grain size. These results are shown in Table II.

Table II

Photo-emf for different grain size and percent lanthanum substituted for lead. The materials are $Pb(Zr_{.65}Ti_{.35})O_3$ with 7% lanthanum substitution for lead and the same material with an 8% lanthanum substitution for lead.

Figure 5:
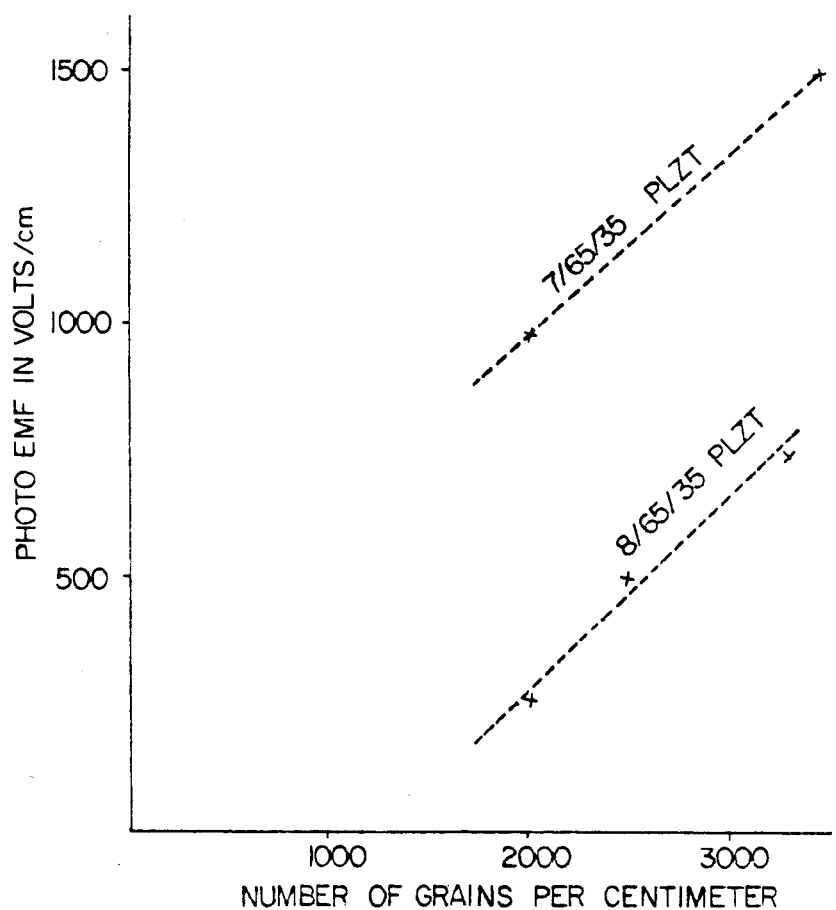
FIG. 5 is a graphical illustration of photo-emf vs. grains per unit length (inverse median grain size) for two different materials.

| Grain Size (microns) | Percent Lanthanum-Lead Substitution (percent) | Saturation Photo-emf (Volts/cm) |
|---|---|---|
| 2–4 | 7 | 1500 |
| 4–6 | 7 | 980 |
| greater than 6 | 7 | 560 |
| 2–4 | 8 | 750 |
| 3–5 | 8 | 510 |
| 4–6 | 8 | 330 |
| greater than 6 | 8 | 250 | the photovoltage v. number of grains per unit length is plotted in FIG. 5 for two different compositions. The plot clearly shows a relationship between the two quantities.

Figure 6:
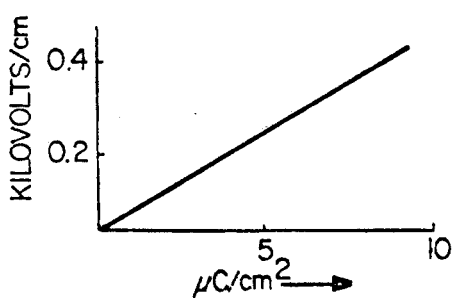
FIG. 6 is a graphical illustration of photovoltage vs. remanent polarization for ceramic Ba Ti $O_3$ + 5wt% $CaTiO_3$.

The fact that the photo-emf of a particular sample depends on the remanent polarization is shown by the results for a typical ferroelectric material, barium titanate + 5wt% $CaTiO_3$, as plotted in FIG. 6.

The short circuit photocurrent depends strongly on the wave length of the impinging illumination. It is a maximum at a wave length resulting in a photon energy equal to the band gap energy of the material. Other wave lengths can, however, contribute strongly to the current.

Figure 7:
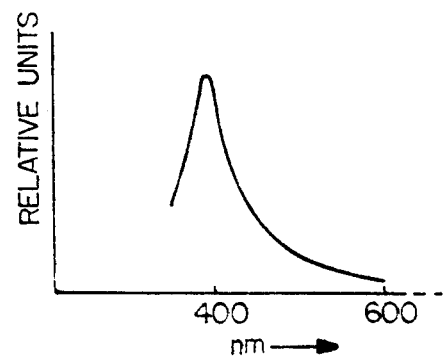
FIG. 7 is a diagram illustrating the short circuit photo-current as a function of wave length for the solid solution Pb $(Zr_{.53}Ti_{.47})O_3$.
Figure 8:
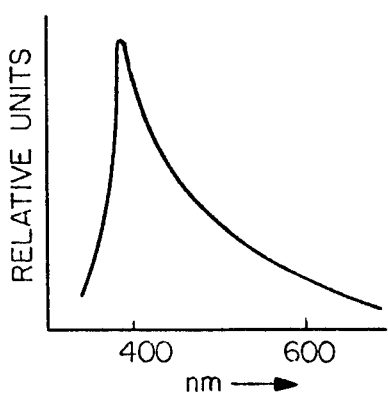
FIG. 8 is a diagram illustrating the short circuit photo-current as a function of wave length for ceramic $BaTiO_3$ + 5wt% $CaTiO_3$.
Figure 9:
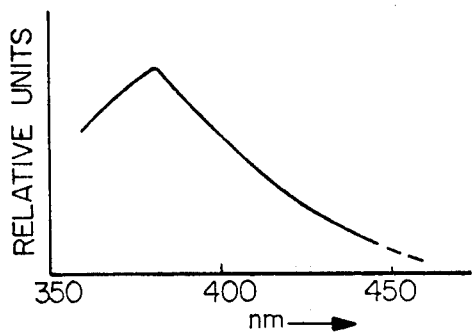
FIG. 9 is a diagram illustrating the short circuit photo-current as a function of wave length for the solid solution Pb $(Zr_{.65}Ti_{.35})O_3$ with 7% of the lead substituted for by lanthanum.

Results for typical materials are shown in FIGS. 7, 8, and 9. The current (ordinate) is that produced by illumination contained in a small band, of about +10 nm about a wave length indicated on the abscissa. A mercury source and notch type dichroic filters were used. The total intensity within each band was only roughly constant. The current that has been plotted has been therefore normalized to constant intensity by assuming the linear relation between the two.

Figure 10:
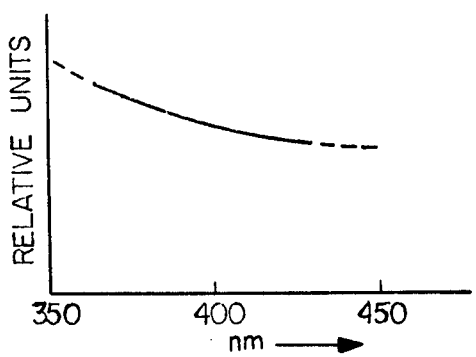
FIG. 10 is a diagram illustrating the photo-emf vs. wave length for the solid solution Pb $(Zr_{.53}Ti_{.47})O_3$ with 1% by weight of $Nb_2O_5$ added.

The photo-emf is less strongly dependent on wave length. Results for a particular material, using notch dichroic filters is shown in FIG. 10. These values are saturation values, roughly independent of intensity.

Figure 11:
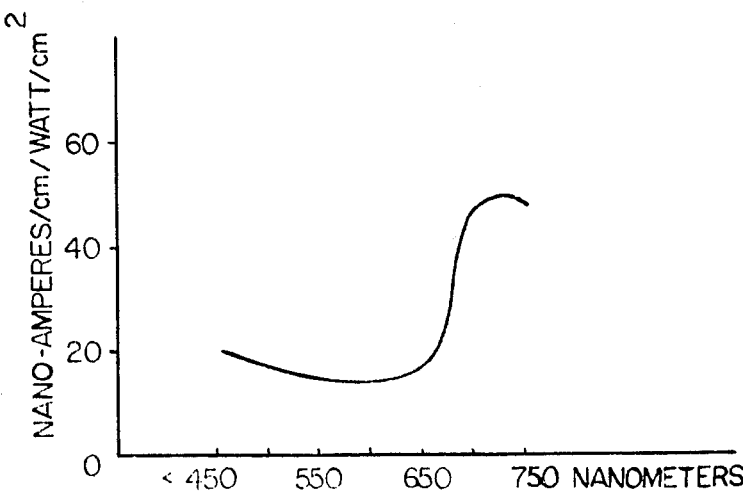
FIG. 11 is a diagram illustrating the photocurrent divided by intensity vs. cut-off wave length of long wave length cut-off dichroic filters, with the materials being Pb $(Zr_{.53}Ti_{.47})O_3$ with 1% by weight of $Nb_2O_5$ added and utilizing a high pressure mercury arc as the illumination source.

An important additional phenomena shows a dependance of current produced in the red and infrared regions in the presence of simultaneous blue band gap radiation. These results are shown in FIGS. 11 and 12. The ordinate (FIG. 11) is the current produced by the light from a mercury arc shining through dichroic long wave length cut off filters, the abscissa the wave lengths above which no light illuminates the sample. Note the step at 650 nm. Using short wave length cut off filters which eliminate the band gap light results in no current until the cut off wave length is below the band gap. These results are shown in FIG. 12. The amount of output in the red actually depends on the intensity of simultaneous band gap radiation, thus the energy efficiency of these materials for a broad band source is not simply the intensity weighted average of the efficiencies for individual wave lengths as produced by notch filter. The actual value is larger.

Photo-emf vs. cut-off wave length for $Pb(Zn_{.53}Ti_{.47})O_3 + 1wt\% Nb_2O_3$ si shown in FIG. 13. A substantial photo-emf appears at long wave lengths but no current can flow. In other words the internal resistance $R_{ph}$ is extremely high unles band gap is incident.

Single Crystal Results

The ceramic results imply a small photo-emf from a single crystal illuminated as shown in FIG. 14. Such emf = 0.55V at room temperature was indeed observed.

Figure 15:
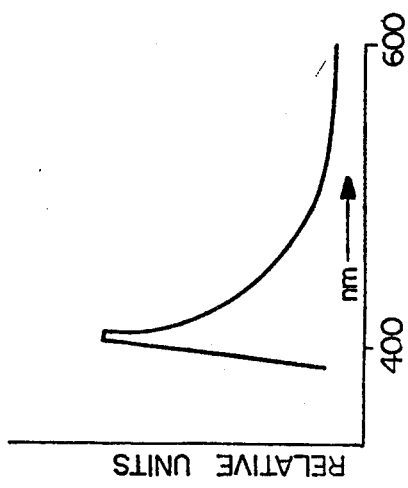
FIG. 15 is a diagram illustrating photocurrent vs. wave length of the single crystal $BaTiO_3$.

The short circuit current is, as for the ceramic material, a strong function of wave length. These results are shown in FIG. 15.

Temperature Dependence

Figure 16:
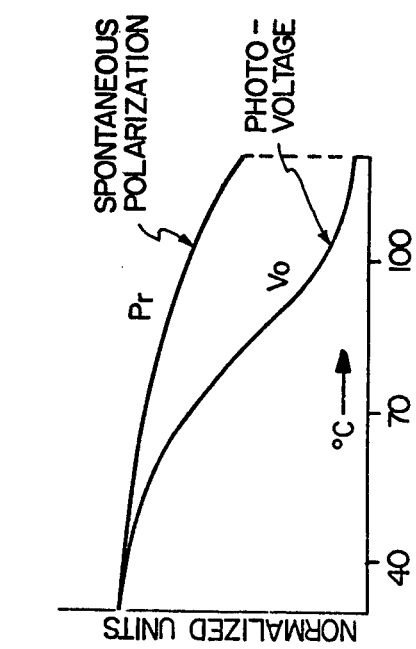
FIG. 16 is a diagram illustrating the photovoltage vs. temperature for $BaTiO_3+5wt\%CaTiO_3$.
Figure 18:
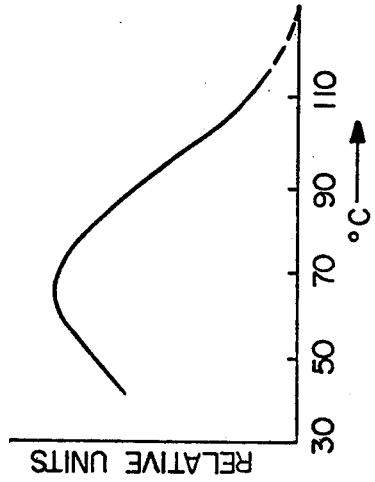
FIG. 18 is a diagram illustrating photocurrent vs. temperature for $BaTiO_3+5wt\%CaTiO_3$.
Figure 17:
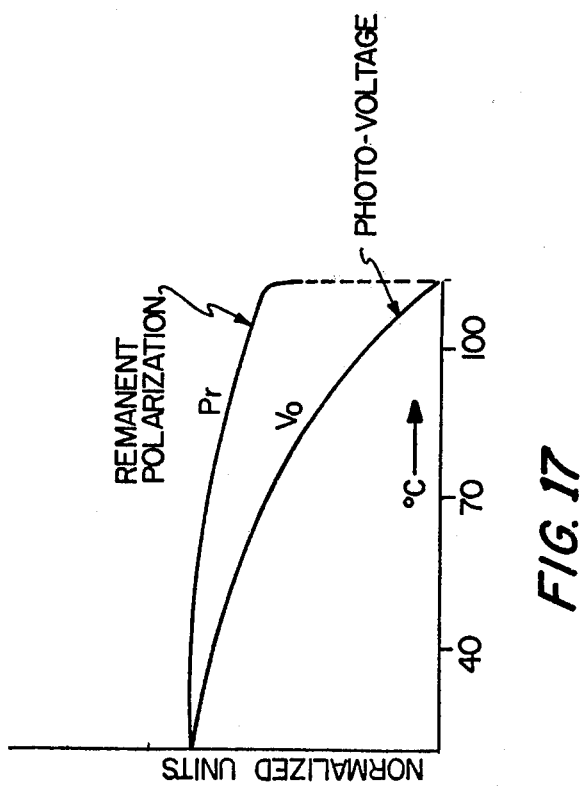
FIG. 17 is a diagram illustrating the photovoltage vs. temperature of single crystal $BaTiO_3$.

Ceramic photo-emf is a function of temperature. Results for barium titanate ceramic with 5 wt% $CaTiO_3$ are shown in FIG. 16. For both $Pb(Zn_{.53}Ti_{.47})O_3$ with 1 wt% $Nb_2O_5$ added and barium titanate the photo-emf decreases with increasing temperature. In these measurements, the temperature ranged to the transition temperature, the photo-emf vanishing at the temperature at which the remanent polarization also vanishes. The remanent polarization vs. temperature for this material is also shown in FIG. 16. Similar results for single crystal barium titanate are shown in FIG. 17. The single crystal photo-emf are, of course, much smaller. Short circuit was measured as a function of temperature. Results for barium titanate +5wt% $CaTiO_3$ are shown in FIG. 18. Similar results over the same temperature range were obtained for $Pb(Zn_{.53}Ti_{.47})O_3$ + 1 wt% $Nb_2O_5$ material. In that case there was no maximum, the photocurrent still increasing with increasing temperature a 130° C.

Effects of Optical Properties

In the arrangement shown in FIG. 1, the direction of polarization, and consequently the direction of the photo-emf is perpendicular to the direction of incidence of the light which is also the direction in which the light is strongly absorbed. The light only enters into a region near the surface of the material. The rapidity of the absorption depends strongly on the wave length of the light, the light becoming fully absorbed in a region closer and closer to the surface as one decreases the wave length of the light and approaches the band gap wave length. For shorter wave lengths, the light no longer enters the material and thus for these wave lengths the light induced effects decrease rapidly with decreasing wave length.

Ceramic materials which exhibit these photo-emf's can appear transparent, translucent, and apparently opaque when viewed with white light. Light, however, obviously enters even the opaque materials to produce the photo-emf's. The apparent opacity is produced by diffuse reflection at granular boundaries. It is of course desirable to minimize the degree to which diffuse relectivity prevents light from entering the material. Nevertheless, the largest photocurrents and greatest photovoltaic efficiency has been originally observed in a material which appears opaque in thickness more than a few thousandths of an inch. The cross sectional drawing FIG. 19 depicts the way light enters the material with the arrangement as originally shown in FIG. 1.

When a circuit connects the electrodes, the maximum density of current occurs near the surface, the current density decreasing in regions deeper within the thickness.

Polishing the surfaces of these materials, however, increases the transparency and, as expected, the magnitude of the photocurrent and the photovoltaic conversion efficiency. An emf will also be produced by the arrangement shown in FIG. 20 provided, of course, that the electrodes are of a nature to allow light to enter the material. Normal thick metal electrodes are opaque to light. When metal electrodes are thin enough, they permit light to be transmitted and yet are sufficiently conductive to function as electrodes. Other conducting transparent electrodes include indium oxide. The emf now will be seen to appear across the thickness of the material, in the direction of the remanent polarization.

In this arrangement the high dark resistance of any unilluminated bulk portion of the material is in series with the circuit connecting the electrodes. The current that can be drawn is limited. Maximum currents can be drawn when the thickness between the electrodes is equal to or less than the absorption depth of the radiation. Since, however, the saturation photo-emf is not a strong function of intensity, vanishing only for extremely low intensities, the full photo-emf per unit length $v_o$ can usually be observed for this samples.

Proposed Mechanism for the High Voltage Photovoltaic Effect in Ferroelectrics Briefly, it is proposed that the photo-emf results from the action of an internal field within the bulk of an individual ceramic grain on non-equilibrium carriers generated by illumination. These carriers move to screen the internal field. The photo-emf that appears is the open circuit result of such screening. A change in charge distribution upon illumination changes the voltage across a grain from an initial value of zero to the photovoltages which are observed.

These photo-emf's appears across individual ceramic grains. What is observed as a length dependent high photovoltage is the series sum of the photo-emf's appearing across grains, each of which is characterized by saturation remanent polarization $P_o$. The situation is shown schematically in FIG. 21. Individual grains typically are small, of the order of 10 microns in diameter. To produce a high photovoltage per unit length in the ceramic the voltage across an individual grain need not be large. For example the results in Table II for Pb(Zn$_{.65}$Ti$_{.47}$)O$_3$ with 7% Lator Pb can be explained by individual grain photovoltage of only about 0.5 volts per grain. The clear implication of the experimental results (Table II and FIG. 5) is that for the range of grain sizes investigated, the photo-emf across a grain is more or less independent of the size of the grain. This is supported also by the single crystal results.

Ferroelectric crystals are characterized by large spontaneous polarization which would be expected to produce large emf's even in the dark. Such emf's are not observed even across highly insulating materials. This is presumed to be the result of space charge within the volume or on the surface of a ferroelectric crystal (which, in ceramics, are the individual grains or crystallites). The space charge produces a potential across a crystal cancelling the potential produced by the net polarization within they crystal. It is obvious that as long as there are sufficient charges within the crystal which are free to move, any potential produced by an internal polarization will eventually vanish.

This dark zero potential state is the initial state of a crystal crystallite, grain, and of the ceramic body composed of these grains. The absence of a net potential in the dark does not however mean the absence of internal fields. Internal fields can be expected to exist and are the consequence of the spatial distribution of the charges which bring the net potentials across grains to zero. These spatial distributions can not be arbitrarily assigned, but are subjected to constraints of a basic physical nature.

In the idealized two dimensional crystal shown in FIG. 22, the surface change density $\sigma = P_s$ reduces the potential between the surfaces to zero. If the surface charge density (in actuality this does not occur) is completely juxtaposed upon the bound polarization surface charge, which has a value $P_s$, then there are no internal fields. Were there no charge, the crystal would show an internal field $P_s/\epsilon_b$ and a potential between the surfaces of $P_s l /\epsilon$ b.

Such a field would be well above the dielectric breakdown strength of a real dielectric. For a single domain typical ferroelectric barium titanate $P_s = 26 \times 10^{-2}$C/m, and the relative dielectric constant $\epsilon_r$ in the direction of polarization is 137. The field that would have to exist in the absence of compensation charge is over $2 \times 10^6$ volts/cm which is well above the dielectric strengths typical of these materials. If such a field could momentarily exist within a ferroelectric crystal it would not exist for long but be reduced from its maximum value to some value below the dielectric strength of the material. The strong field would break down the material and a charge flow would produce a space charge distribution resulting in a new lower value for the internal fields within the crystal.

Such a space charge distribution must exist in an actual crystal. The space charge serves to reduce the potential across a crystal to zero. Such charges have limited mobility and the materials continue to behave as insulators for ordinary strength applied fields.

Such a space charge cannot occupy a delta function-like region as in the idealized situation shown in FIG. 22, but must occupy instead a finite volume. If these are localized near the surface of the crystal, then an internal field $\epsilon_b$ exists within the bulk of the material and additional fields $E_s$ exist within the space charge regions near the surface.

It is hypothesized that these space charge regions are near the surface of real crystals with the charge distributed within a surface layer thickness $s$. The reasons for same are as follows: (1) The surface regions of ferroelectric crystals are characterized by regions whose dielectric, ferroelectric, and thermodynamic properties differ markedly from that of the bulk. These differences are best explained by the existance of strong fields in this region that would be produced by space charge. There is a considerable body of information in the literature supporting the existance and delineating the properties of these layers; (2) The interplay of space charge and the very non-linear dielectric constant of ferroelectric would be expected to localize space charge in a low dielectric constant layer near the surface. In ferroelectrics, unusually high, low field relative dielectric constants (of the order of 1000) can be expected to reduce in value with increasing field strength. Thus charge in a region reduces the dielectric constant of that region increasing the field strength of that region. This feedback mechanism can be shown to localize charge within a layer.

The experimental results supporting the existance of surface layers will not be reviewed here, nor the calculations which support the localization of charge into layers as a result of a non-linear (saturable) dielectric constant. These may be reviewed by referring to the literature.

A schematic description of a typical grain, i.e. crystallite, with space charge regions of thickness $s$, and a bulk region of thickness l, is shown in FIG. 23. The internal fields (in the two dimensional model) of such a charge distribution superimposed on that produced by the bound polarization charge will be calculated and also the effect of these fields on carriers within the bulk produced as the result of an internal photo effect (photoionization). Formulae for the photo emf that will be derived will have the correct sign, a linear dependence on remanent polarization, and the kind of temperature dependence that has actually been observed. In addition there will result an estimate of a size independent grain photo-emf for a typical ferroelectric, barium titanate, which is consistent with that implied from the observed ceramic emf, and single grain emf. The grain has as shown in FIG. 23: 1) A bulk region with dielectric constant $\epsilon_b$ and uniform polarization (at zero applied field) $P_o$; 2) Surface layers of dielectric constant $\epsilon_s$, considerably less than that of the bulk. There are also polarization in the surface regions $P_s(x)$ which exist at zero applied field. These will generally be parallel to the bulk polarization at one end and anti-parallel at the other end; 3) Space charges in these surface layers which serves to remove any potential across the grain. It is the space charge layers which produce high fields which reduce the highly non-linear dielectric constant of the bulk to the lesser value in the surface layers, and also produce the remanent polarization, $P_s(x)$ with the surfaces.

Such a structure also has an internal bulk field, and surface fields which can be calculated. For the purposes of this calculation we assume a simple two dimensional model shown in FIG. 24.

The polarization with the various regions are assumed only for simplicity to be uniform within these regions. Again, only for simplicity those in the surface layers and the bulk are assumed equal in magnitude (i.e. $P_s(x) = P_o$). The space charge densities $\pm n_o e$ are also assumed uniform and equal in magnitude. The polarizations are equivalent to four bound surface charge densities, $$\vec{\sigma_1} = \vec{P_o} \quad \sigma_2 = -2\vec{P_o}$$

$$\sigma_3 = o \quad \sigma_4 = \vec{P_o}$$

Figure 24:
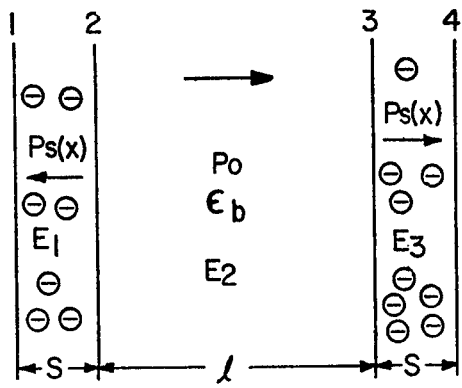
FIG. 24 is an illustration depicting a model of a crystal of length l.

There are, using Gauss's law, electric fields as shown in FIG. 24.

$$E_1 = \frac{1}{\epsilon_s} [P_o + m_e ex]$$

$$E_2 = \frac{1}{\epsilon_b} [-P_o + m_e es]$$

$$E_3 = \frac{1}{\epsilon_s} [-P_o + n_e e(s-x)]$$

It has been assumed that the voltage across the crystal vanishes, $$\int_0^{l+2s} E(x)dx = O$$

$n_o$ and $s$, from this and the three preceeding equations, must be related by the expression $$m_e es = \frac{P_o}{1 + \frac{\epsilon_b}{\epsilon_s} \frac{s}{l}}$$

and the bulk field $$E_2 = \frac{-P_o}{\epsilon_b} \left[ \frac{\frac{s}{e} \frac{\epsilon_b}{\epsilon_s}}{1 + \frac{s}{l} \frac{\epsilon_b}{\epsilon_s}} \right]$$

Surface layers in barium titanate ceramic grains have been estimated at $10^{-6}$ cm (see for example Jona and Shirane Ferroelectric Crystals, Pergammon Press, 1962). The remanent polarization typical of the ceramic material is about $8 \times 10^{-2}$ C/m², the relative dielectric constant of the poled ceramic about 1300. The high field dielectric constant will be estimated at roughly 0.5 the bulk dielectric constant. These numbers yield a bulk field, for a typical $10^{-3}$ cm grain of, $$E_2 = 350 \text{ volts/cm}$$

The potential across the bulk would thus be approximately $-.35$ volts. The remaining potential across the grain would be that across the surface layers.

Illumination has the effect of producing charges which screen the internal field, $E_2$, causing it to vanish. The negative voltage vanishes and a positive potential appears across the sample. The light makes the sample look more positive. This is exactly what happens as the result of a thermally-induced decrease in polarization. Thus the pyroelectric voltage is in the same direction as the photovoltage as is experimentally observed.

In the fully screened case, the photo-emf is also the emf across the two surface layers $$\Delta V = \left[ \frac{P_o}{\epsilon_s} \frac{1}{1 + \frac{\epsilon_b}{\epsilon_s} \frac{s}{l}} \right] S \approx .35 \text{ volts}$$

The light generated free electrons sets up a counter field which tends to cancel the bulk field $E_2$; thus, the observed voltage drop is less than it would be in a perfectly insulating medium. This is what is meant by the term screening. The counter field approaches $-E_2$. Assuming the shielding occurs only in the bulk, the total voltage across the grain is now the sum of the voltages across the surface layers.

The photo-emf is in the opposite direction to the bulk polarization. This fact predicted in the theory is what is always observed experimentally. The complete screening of the bulk field thus would, in barium titanate, be expected to result in a photo-emf of $+.35$ volts per grain or 350 V/cm and about 0.35 volts across a macroscopic single crystal. These are roughly the values actually observed as seen in Table I, and with the single crystal results. The linear relation between remanent polarization and saturation photo-emf as shown in FIG. 6 is also predicted by these equations. The dependence on temperature of the photo-emf as shown in FIGS. 16 and 17 is predicted by the fact that as one approaches the curie temperature, not only is $P_o$ decreasing but the dielectric $\epsilon_s$ is increasing. The bulk internal field, $E_2$, should therefore decrease with temperature more rapidly than the remanent polarization.

Screening

Solving the general problem of screening in a ferroelectric is difficult. Many of the principles involved can be demonstrated by solving a special case. The special case is meant to be particularly applicable to the $Pb(Zr_{.53}Ti_{.47})O_3 + 1wt\% Nb_2O_5$ material.

Utilized, only for simplicity, is a two dimensional model, with photo-produced carriers limited to those of a single sign. It will be assumed that these are electrons generated from deep trapping levels midway in the band gap, and that the illumination empties all the traps leaving fixed positive charges to replace the original traps. The complete emptying of a deep trapping level would produce the long wave length photovoltages and the phenomena of an intensity saturation of the photo-emf typical of the $Pb(Zr_{.53}Ti_{.47})O_3 + 1wt\% Nb_2O_5$.

Figure 25:
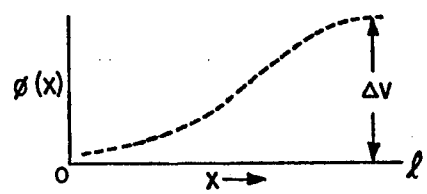
FIG. 25 is a diagram illustrating the potential distribution in an illumenated crystal.

Consider a two dimensional illuminated slab of length l within which is an internal field $\epsilon$ and within which light generates a uniform density of electrons $n_o$ ($n$ electrons per unit length). Schematically the situation is shown in FIG. 25, where $\phi(x)$ is the potential at a point $x$.

The carriers respond to the internal field and occupy a Boltzman distribution $$M = M_o e^{\vartheta/KT}$$

If the fields due to the electrons could be neglected, then $$\vartheta(e) = -Ex$$

This is, of course, too rough an approximation. With $n(O)$ the density of electrons at $x=0$, and $n_o$, the density of the immobile donor ions $$m(x) = m(o)e^{\vartheta(x)/kt}$$

with $\phi(x)$ given by Poisson's equation, $$\frac{d^2\phi}{dx^2} = \frac{e}{\epsilon}[m(x) - m(o)] = \frac{e}{\epsilon}[m(o)e^{e\phi(x)/kT} - m_o]$$

Since for $\phi=0$ $n(0)=n_o$, and since all traps are emptied, assuming electrical neutrality, $$\int_0^l m_o \int_0^l e^{e\phi/kT} dx = m_o l$$

or $$m_o \int_0^l e^{e\phi/kT} dx = m_o l$$

then $$\int_0^l \frac{d^2\phi}{dx^2} dx = \int_0^l \frac{e}{\epsilon}[m(x) - m_o] dx = 0$$

or $$\frac{d\phi}{dx}\bigg|_{x=l} = \frac{d\phi}{dx}\bigg|_{x=o}$$

If the crystal is neutral there must be no electric field at the boundary except the applied field $-E_o$ $$\frac{d\phi}{dx}\bigg|_{x=o} = E_o$$

$$\frac{d\phi}{dx}\bigg|_{x=l} = E_o$$

These two boundary conditions allow the solution of Poisson's equation.
Rewriting $$\frac{d^2\phi}{dx^2} = \frac{m_o e}{\epsilon}\left[\frac{m(o)}{m_o} e^{e\phi/kT} - 1\right]$$

or $$\frac{d^2\phi}{dx^2}\left[\frac{e\phi}{kT}\right] = \frac{M_o e^2}{\epsilon kT}\left[\frac{M(o)}{M_o} e^{e\phi/kT} - 1\right]$$

substituting $$y_o = \ln\frac{M_o}{m(o)} \quad y = \frac{e\phi(x)}{kT}, \quad l_D^2 = \frac{\epsilon kT}{m_o e^2}$$

we obtain, $$\frac{d^2y}{dx^2} = \frac{1}{l_D^2}[e^{y-y_o} - 1]$$

in this new notation, $$\frac{dy}{dx}\bigg|_{x=o} = \frac{dy}{dx}\bigg|_{x=l} = \frac{eE_o}{kT}$$

let $$\frac{dy}{dx} = P$$

$$\frac{d^2y}{dx^2} = \frac{dP}{dx} = \frac{dy}{dx}\cdot\frac{dP}{dy} = P\frac{dP}{dy} = \frac{d}{dy}\left(\frac{1}{2}P^2\right)$$

so $$\frac{d}{dy}\left(\frac{1}{2}P^2\right) = \frac{1}{l_D^2} e^{y-y_o} - 1$$

setting $y(o)=0$ since the zero for a potential may be set arbitrarily $$\frac{1}{2}P^2(l) - \frac{1}{2}P^2(o) = \frac{1}{l_D^2}\int_0^l (e^{y-y_o} - 1) dy$$

$$= \frac{1}{l_D^2}[e^{y(l)-y_o} - y(l) - e^{-y_o}]$$

$$y(x) = \frac{e\phi(x)}{kT}$$

$$y(l) = \frac{e\Delta v}{kT}$$

$$\frac{dy}{dx}\bigg|_o = \frac{dy}{dx}\bigg|_l = P(o) = P(l)$$

so $$0 = \frac{1}{l_D^2} e^{-y_o}[(e^\Delta - 1) - \Delta]$$

where $\Delta = \frac{e}{kT}\Delta v$ or $e^{y_o} = \frac{e^\Delta - 1}{\Delta}$, and thus $\frac{M_o}{M(O)} = \frac{e^\Delta - 1}{\Delta} = \frac{e^{\frac{e}{kT}\Delta v} - 1}{\frac{e}{kT}\Delta v}$ substituting $$\frac{d}{dy}(\tfrac{1}{2}P^2) = \frac{1}{l_D^2}\left[\frac{\Delta}{e^\Delta - 1} e^y - 1\right]$$

so $$\tfrac{1}{2}P^2(x) - \tfrac{1}{2}P^2(o) = \frac{1}{l_D^2}\left[\frac{\Delta}{e^\Delta - 1}(e^y - 1) - y\right]$$

$$= \frac{1}{l_D^2}\left[\Delta\frac{e^y - 1}{e^\Delta - 1} - y\right]$$

Thus $$\left(\frac{dy}{dx}\right)^2 = \left(\frac{eF_o}{kT}\right)^2 + \frac{2}{l_D^2}\left\{\Delta\left(\frac{e^y - 1}{e^\Delta - 1}\right) - y\right\}$$

or $$\frac{dy}{dx} = \frac{\sqrt{2}}{l_D} \sqrt{\Gamma^2 + \Delta\left(\frac{e^y - 1}{e^\Delta - 1}\right) - y}$$

where $$\Gamma^2 = \frac{1}{2} \frac{e}{kT} E_o l_p$$

integrating this equation from O to 1 yield $$\int_o^{y(l)} \frac{dy}{\sqrt{\Gamma^2 + \Delta\left(\frac{e^y - 1}{e^\Delta - 1}\right) - y}} = \frac{\sqrt{2}}{l_D} \int_o^l dx$$

or, $$\int_o^\Delta \frac{dy}{\sqrt{\Gamma^2 + \Delta\left(\frac{e^y - 1}{e^\Delta - 1}\right) - y}} = \frac{\sqrt{2}\, l}{l_D}$$

which is an implicit expression for $\Delta V$ in terms of $E_o$, $l$, and $l_D$.

For low $n_o$ and/or large $E_o$, $\Gamma$ is large $$\int_o^\Delta \frac{dy}{\sqrt{\Gamma^2}} = \frac{\sqrt{2}\, l}{l_D}$$

$$\Delta = \sqrt{2}\, l \Gamma / l_D$$

or $$\Delta = \sqrt{2}\, l \times \frac{1}{\sqrt{2}} \left[\frac{e}{KT} E_o l_D\right] l_D$$

$$= \frac{e}{KT} E_o l$$

or $$\Delta V = E_o l$$

which is the original potential across the bulk of the crystal.

The situation of interest is however large $n_o$ and small $l_D$ and small $\Gamma^2$.

It is in this situation that $$\Delta = \frac{e}{KT} \Delta V$$

can be expected to vanish.

Expanding the expression for $\Delta$ small, which is always the case, then $$\Delta \frac{e^y - 1}{e^\Delta - 1} - y \approx \frac{1}{2} y^2 - \frac{1}{2} y \Delta$$

Keeping only second order terms in $y$ and $\Delta$, then $$\int_o^\Delta \frac{dy}{\Gamma^2 + \frac{1}{2}(y^2 - y\Delta)} = \frac{l\sqrt{2}}{l_D}$$

Let $$\xi = y - \frac{\Delta}{2},$$

this becomes $$\int_{-\sigma/2}^{\Delta/2} \frac{d\xi}{\sqrt{(\Gamma^2 - \frac{1}{4}\Delta^2) + \frac{1}{2}\xi}} = \frac{l\sqrt{2}}{l_D},$$

Setting $$\xi = \sqrt{2\Gamma^2 - \left(\frac{\Delta}{2}\right)^2}, \sin h\, O$$

gives $$2\sqrt{2} \sin h^{-1} \left[\frac{\Delta/2}{\sqrt{2\Gamma^2 - \left(\frac{\Delta}{2}\right)^2}}\right] = \frac{\sqrt{2}\, l}{l_D}$$

or $$\Delta = 2\sqrt{2}\, \Gamma \tan h \frac{l}{2l_D}$$

or $$\Delta V = E_o(2l_D) \tan h \frac{l}{2l_D},$$

clearly as $$l_D \to O\ \Delta V \to O$$

This approximation for $\Delta V$ is good for all reasonable values of T.

Illumination thus reduces the dark bulk emf $= E_o l$, producing a net photovoltage $$V_{PHOTO} = E_o l \left[1 - \frac{\tanh \frac{l}{2l_D}}{\frac{l}{2l_D}}\right]$$

where $$l_D = \sqrt{\frac{EkT}{n_o e^2}}$$

A simplified expression occurs for small $$\frac{l}{2l_D}$$

where, $\tanh x \approx x - \frac{1}{3}x^3$ $$V_{PHOTO} = E_o\left[\frac{1}{2}\left(\frac{l}{2l_D}\right)^2\right]$$

Here, it is clear that the photovoltage becomes insignificant for $$\frac{l}{l_D}$$

small.

The implication is therefore that photovoltaic contributions from the bulk will be much larger than that from the surface layers, for surface layers are extremely small white $l_D$ can be estimated as very roughly equal in the bulk and the surface.

Thus, illumination will result in the vanishing of the internal field within the bulk resulting in a max photo-emf.

$\Delta V = 0\ E_2 l$ where $E_2$ is the bulk field.

For small intensities, we can assume $n_o$ small, then $$V_{PHOTO} = E_o\rho\frac{1}{4}\frac{n_o e^2}{ekT}$$

i.e., the photovoltage is proportional to $n_o$ which can be reasonably assumed proportional to intensity which is experimentally observed (see FIG. 4).

The model just described explains the long wave length photoemfs, in the material Pb($_{.53}$Zr,$_{.47}$Ti)0$_3$ + 1wt% Nb$_2$O$_5$. Such a deep trapping level is probably typical of the lead titanate-lead zirconate materials with characterisic lead vacancies. These bind electrons leaving holes (producing p type dark conductivity). The addition of common dopants — for examle niobium gives rise to free electrons which combine with holes or get trapped by the lead vacancies. The doping can thus be said to provide electrons which fill traps.

It is these trapped electrons which are photo-injected into the conduction band by the long wave length light providing near maximum photo-emfs in material illuminated at 500 nm and even longer wave lengths as shown in the results plotted in FIG. 13. Full saturation, that is the complete shielding of the bulk internal field, requires however band gap carriers which occurs as one approaches the 373 nm band gap wave length. Solving this problem, that of band gap carriers in addition to electrons generated by deep traps, can be accomplished in a manner similar to that which was accomplished for the trapped electrons but is more complex for example because mobile holes are being produced in addition to electrons and one cannot necessarily fix the maximum number of carriers.

The photo-emfs are created by photo-induced carriers shielding the bulk field. Effectively, no photocurrent can flow however unless band gap light is present as is clear from the results shown in FIGS. 12 and 13. Here it is clear the band gap light produces maximum photo-emf and maximum photocurrents, less than band gap light, max or almost maximum photo-emf but no photocurrents and that the output resistance under these circumstances appears extremely high. Addition of band gap light allows current to flow.

The tentative explanation is that the surfae layers from high resistance barriers, the magnitude of which lowers with band gap light. The surface layers thus act as intrinsic photoconductors in series with an emf. This picture not only explains the rather unique dependence of photo-emf and short circuit photo-current on wave length as shown in FIGS. 12 and 13 but also the equivalent curcuit which is typical of all these materials as described in FIG. 2 and as indicated by the current-voltage results in FIG. 3.

A possible explanation for the high resistance of the surface layers is that they include quantities of charged ions which have been localized there. These are immobile under normal applied voltages moving only under the action of high fields such as produced by the reversal of the remanent polarization. Those ions not only will occupy trapping levels, eliminating the need for easily ionized trapped electrons and thus reducing the intrinsic conductivity but also form centers for coulomb scattering of conduction electrons which should contribute markedly to the resistivity.

Efficiency

Some insight into the possible maximum efficiency of the process can be obtained by considering carriers generated by band gap light. with potential energy $$U = 2\int_o^L e\circ(x)\delta M_2 dx$$

with $\circ(x) < Ex$
so that a maximum value of energy $$U = 2e\int_o^L E\delta mx dx$$

$$= e\delta m_o EL^2$$

The energy required to produce $\delta m_o$ electron hole pairs $$\epsilon = \delta M_o L\ E_g$$

where Eg is the band gap energy.
The power into the crystal is $$P_m = LEg\frac{\delta M_o}{\delta t}$$

while the power out (the rate of increase in internal potential energy) is $$P_{out} = eEL^2\frac{\delta M_2}{\delta T}$$

The efficiency $$= \frac{eEL}{Eg}$$

For Pb(Zr$_{.53}$Ti$_{,47}$)o$_3$ + 1 wt% Nb$_2$O$_5$ added E is roughly 600 v/cm and the grain size roughly 5 microns. The emf across a grain is thus about .3 volts. The band gap is about 3 eV. Thus the efficiency is $$\simeq \frac{.3}{3} \simeq 10\%,$$

Which compares with an observed band gap efficiency of about .06%. The calculation, of course, depends on idealizing assumptions, some of which may be practically obtainable.

PHOTOVOLTAIC MEMORY DEVICE

With the above background and general teachings of the unique discovery of the invention now firmly in mind, numerous and important applications of the properties of the ferroelectric ceramics above-discussed are readily possible as will be evident to those skilled in this art. For example, the device of the instant invention will be shown to exhibit particular utility as a memory apparatus, thus making use of the property of the ferroelectric ceramic defined as remanent polarization or "memory" as previously explained.

Figure 26:
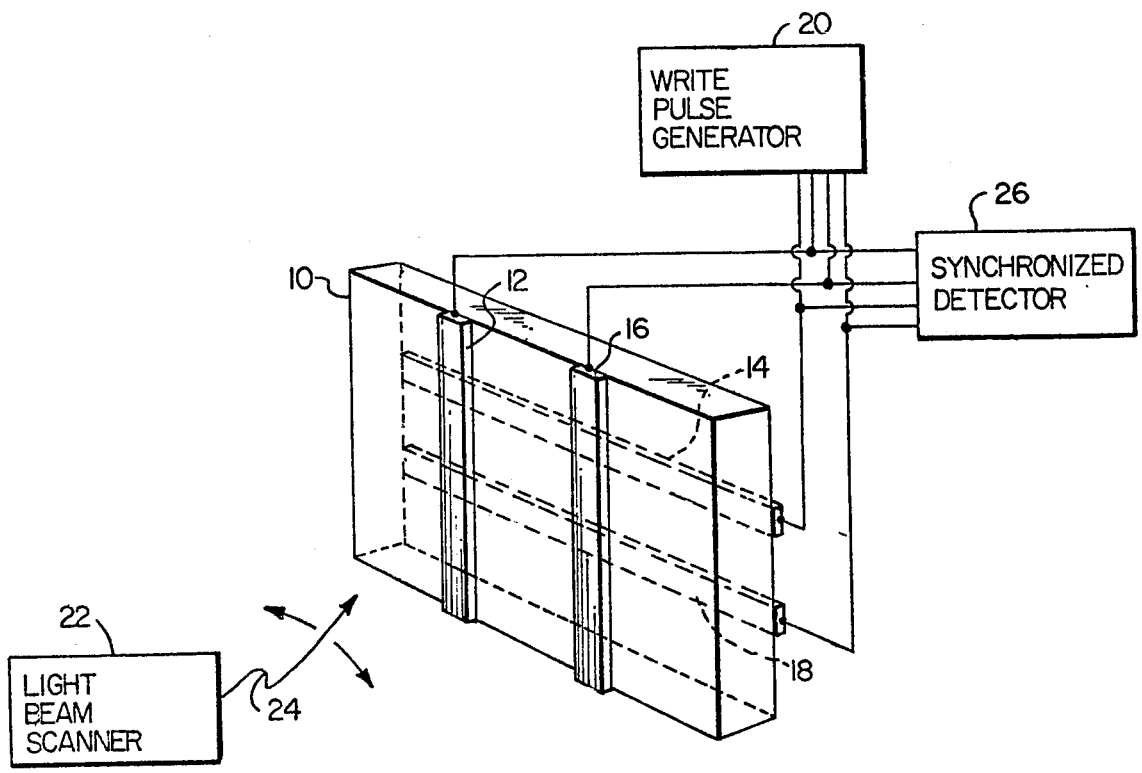
FIG. 26 is a schematic representation of the instant inventive ferroelectric ceramic substraight utilized as a photovoltaic memory device with optical scanning.

With particular reference now to FIG. 26 of the application drawings, one such photovoltaic memory apparatus is disclosed, the memory apparatus being optically addressed. In this respect, a substrate or sheet of a ferroelectric ceramic material of the type above-discussed is indicated by reference numeral 10 as being "sandwiched" between at least one pair of electrodes such as electrodes 12 and 14 disposed on opposing sides of the substrate.

In the preferred embodiment as shown, an array of electrode pairs, such as pairs 12–14 and 16–18 are disposed on opposing sides of the substrate 10 as to define a matrix configuration. Information is put into the memory and particularly into the region of the substrate 10 lying between electrode pairs by temporarily applying a voltage pulse of a predetermined polarity between the electrode pairs, such pulse being provided by the Write Pulse Generator 20 coupled to the various electrodes and of typical construction. Specifically, if a positive voltage pulse was provided by the Write Pulse Generator 20 between electrode pairs 12–14, with electrode 12 being presumed to be the positive electrode in this example, a remanent ferroelectric polarization will take place in the region of substrate 10 lying between the crossed electrode pair, this remanent polarization being in a direction and of a polarity dependent upon the polarity of the write pulse.

Similarly, if a negative voltage pulse was applied between electrode 16 on the one hand, and electrode 18 on the other hand, with electrode 16 in this instance being presumed to have the negative polarity, a remanent polarization within the ferroelectric ceramic 10 will take place in the region disposed between the intersecting or crossed electrodes 16 and 18. In a similar fashion, predetermined remanent polarization can be produced individually in all of the regions of the ferroelectric ceramic 10 that are disposed between crossed electrode pairs of the matrix array in direct dependence upon the polarity of the write pulse voltage applied, this remanent ferroelectric polarization constituting stored information in that such polarization within the ceramic will remain until removed by the application of a write voltage pulse of opposing polarity.

In accordance with the teachings of the instant invention, these stored "bits" of information in the form of remanent ferroelectric polarization within the various regions of the substrate 10 can be extracted or "read" by selectively illuminating the poled regions of the substrate with a beam of light, as preferably can be provided by a laser, for example. Upon illumination, the polarized regions of the ferroelectric ceramic will produce a photovoltaic current and voltage at an associated electrode pair, with the polarity of the photocurrent and photovoltage being dependent upon the "stored" remanent ferroelectric polarization or "information" within the particular region of the substrate.

In the preferred embodiment of the device wherein a so-called matrix configuration of the electrode pairs are provided, the entire ferroelectric ceramic substrate can be scanned by the illuminating beam which is contemplated to be continuously swept in the fashion of a "light pencil" by a light beam scanner of conventional construction as is designated by reference numberal 22, for example, light beam scanner 22 providing the sweeping illuminating beam designated by reference numeral 24. Further, and in this particular embodiment, the illumination from the light beam 24 would be transmitted into the associated poled regions of the ferroelectric ceramic 10 by passing through electrodes 12, 16 etc. disposed on the surface of the ceramic facing the illuminating beam, electrodes 12, 16, etc. being constructed so as to be transparent.

The generated photovoltaic currents and voltages at the electrode array would be detected by a sychronized detector designated by reference numeral 26 coupled to each of the electrode pairs, detector 26 being of conventional construction and serving to monitor the polarity of the photovoltaic currents and voltages developed in time synchronism with the light beam scanner 22. Such synchronism can be effected through a direct coupling of the detector 26 to the light beam scanner 22 in typical fashion, or through the utilization of an external computer clock, all in accordance with standarized matrix memory addressing techniques.

Optical Display Apparatus

The discovered properties of the ferroelectric ceramic substrate of the instant invention can further be applied in conjunction with liquid crystals to fabricate a novel display apparatus and, in this respect, attention is generally directed to FIGS. 27 through 32 of the appended application drawings.

The operational principle associated with the fabrication of such optical displays relies upon the utilization of the photovoltaic currents and voltages generated by substrates of a ferroelectric ceramic material to effect switching of the opacity state of a liquid crystal operating in the field - effect mode. This generalized combination will be seen to provide a write-in read-out memory and optical display. Both the liquid crystal and the ferroelectric ceramic effectively function as a memory, either in a binary or bi-stable mode having two possible states designated as an "on" state or an "off" state wherein the liquid crystal is switched from a substantially transparent condition to a substantially opaque condition, or in a multistate mode by which the transmission characteristics of the liquid crystal are varied through many states to effect a so-called gray scale display.

With particular reference to FIG. 27 of the application drawings, a typical optical display device following the general teachings of the instant invention is shown, such display device providing so-called dark spot display capabilities. As depicted in FIG. 27, a twisted nematic liquid crystal is designated by reference numeral 28, such crystal being sandwiched between two transparent electrodes 30 and 32.

As is known, the twisted nematic liquid crystal 28 will vary its transmission characteristic to incident light dependent upon the polarity and magnitude of a voltage applied across electrodes 30 and 32. Specifically, the twisted nematic liquid crystal 28 serves to transmit illumination therethrough as long as there is no voltage across electrodes 30 and 32. In conjunction with the twisted nematic liquid crystal 28, a linear polarizer 34 is provided, as is an analyzer 36 of conventional construction. The linear polarizer 34 and the analyzer 36 are crossed so that no light passes through the combination to a diffuse reflector 38 except for the fact that the twisted nematic liquid crystal cell interposed therebetween rotates the polarization of the incident illumination by 90° so as to allow passage of light. Application of a voltage across the cell electrodes 30 and 32 destroys the ability of the liquid crystal cell 28 to rotate the plane of the polarization of the illumination and the illumination is consequently absorbed in the analyzer 36 rather than transmitted and reflected off the diffuse reflector 38.

Accordingly, when voltage is applied across electrodes 30 and 32, a dark color of the liquid cell would be displayed in so-called dark spot display. The magnitude of the display is dependent upon the magnitude of the applied voltage, such that a voltage applied across cell electrode 30 and 32 less than a characteristic amount necessary to effect full plane rotation will only partially reduce the rotating ability of the liquid crystal 28 thereby resulting in only a partial extinction of illumination and the generation of a gray-scale display. The above discussion of the operation of a so-called twisted nematic liquid crystal is entirely conventional.

To obtain the switching voltage for application to the cell electrodes 30 and 32, a substrate of a ferroelectric ceramic designated by reference numeral 40 it utilized, the substrate 40 being sandwiched between electrofes 42 and 44 as shown, ceramic substrate 40 being disposed such that the illustrated illumination impinges not only on the liquid crystal 28, but also on the ceramic substrate. As illustrated, electrodes 42 and 44 of the ceramic substrate 40 are respectively coupled to the transparent electrodes 30 and 32 of the twisted nematic liquid crystal cell 28.

Initially, a polarization voltage is applied to the ferroelectric ceramic substrate 40 across the associated electrodes 42 and 44, such voltage being in the form of a pulse and serving to produce a remanent polarization in the direction of the arrow shown within the substrate. Subsequently, and in accordance with the teachings of the invention, when the substrate 40 is illuminated, a current will flow in a circuit connecting terminal 42 to terminal 30 of the liquid crystal cell 28, through the cell 28 to electrodes 32, and then to terminals 44 of the ceramic substrate 40, this current being a photovoltaic current proportional to the magnitude of the remanent polarization effected within the ferroelectric ceramic by the initial application of the polarization voltage pulse.

The magnitude of the photovoltaic current can be varied in accordance with the generalized teachings of the instant invention discussed at the outset by simply varying the magnitude of the initial polarizing pulse. The so-called gray-scale display capability of the light transmission characteristics of the liquid crystal 28 is provided simply through a pre-selection of the magnitude of the remanent polarization produced and, of course, assuming a constant intensity illumination. The memory characteristics of the ferroelectric ceramic 40 are inherently brought about in that the value of the photovoltaic current can be changed only through the application of another polarizing pulse. Thus, the generalized apparatus of FIG. 27 functionally constitutes an apparatus which effects an optical display of the state of the memory within ferroelectric ceramic substrate 40.

In the embodiment as described in FIG. 27, a so-called "dark spot display" was effected. In the event that a so-called "bright spot" is desired to appear during the "on" state of the liquid crystal in transmission or reflection, polarizer 34 and analyzer 36 would be disposed in a parallel relationship with respect to one another, rather than crossed. Further, and although the basic embodiment above-discussed refers to the utilization of liquid crystals of the twisted nematic type, similar results can be obtained with so-called color switching crystals which, in like fashion, alter their light transmission characteristics to incident polarized light in response to the application of a voltage thereacross.

In accordance with the generalized teachings of FIG. 27, various other forms of optical displays can be constructed. For example, and with particular reference to FIG. 28 of the application drawings, a different form of combined memory and optical display apparatus is illustrated, this apparatus making use of a color switching liquid crystal 46 instead of the twisted nematic liquid crystal 28 of FIG. 27. As was explained above, the color switching liquid crystal such as crystal 46 serves to alter its light transmission characteristics to incident polarized light, and it is for this reason that the light source illustrated in FIG. 28 is defined as being polarized illumination, although it is to be understood that in this embodiment, as well as in the following embodiments to be discussed which use color switching liquid crystals, a non-polarized light source can be provided if a linear polarizer is disposed within the apparatus on the side of the liquid crystal nearest the incoming illumination.

The display apparatus of FIG. 28 defines a so-called monolithic structure as oppposed to the exemplary structure of FIG. 27 wherein the liquid crystal was physically spaced from the energizing ferroelectric ceramic. In FIG. 28, a "sandwich" construction is provided comprising a face plate 48, a transparent electrode 50 coupled to ground, the color switching liquid crystal 46, a slab or substrate of a ferroelectric ceramic 52, and a plurality of electrodes such as electrodes 54 coupled to the ferroelectric ceramic 52 in an array.

When a short voltage pulse is initially applied between the ground electrode 50 and one of the polarity of rear electrodes 54, the region of the liquid crystal 46 immediately in front of the rear electrode 54 will become transparent resulting in a potential appearing between the semi-transparent ground electrode 50 and the rear electrode 54 due to the incident illumination. In this instance, the ferroelectric ceramic material 52 would preferably be a transparent ceramic, such as 0.020 inch disk of 8.5/65/35 PLZT with a grain size of 6 microns, polarized in the thickness direction and producing a photo-emf of about 30 volts and a short circuit current of $10^{-7}$ amperes/$cm^2$ per watt per $cm^2$ input at 388 nm, for example. Further, the rear electrodes 54 are contemplated to be of a transparent variety, such as indium oxide 50 that a display can be provided in transmission.

A further variant of the operation of the device of FIG. 28 is possible, eliminating the necessity for the initial application of a short voltage pulse between the ground electrode 50 and one of the plurality of rear electrodes 54 to commence the process of clearing of the liquid crystal 46. In this respect, and in addition to the normally provided uniform polarized illumination, an additional intense source of light providing a thin beam such as a laser would be provided, the laser constituting a so-called "light pencil". Upon application of the intense pencil beam of light of the apparatus of FIG.

28, such intense light would penetrate the liquid crystal even in its nominally closed state thus illuminating the ferroelectric ceramic 52, such illumination causing a photovoltage to be generated as above-discussed which would then appear across the liquid crystal in the region of the intense light beam causing that region to become transparent and allowing the uniform polarized illumination to penetrate into that region, such uniform illumination further clearing the crystal in a regenerative process. This would result in a clear region which looked bright under reflected light, and a current flowing from the associated rear electrode 54 to ground, for example, through a non-illustrated resistor that would be provided. With this modification, the intense beam of light constituting the "light pencil" can be utilized to actually enter a line drawing into the display, with a point by point read-out being provided.

As opposed to obtaining a point-by-point electrical read-out, the image written-in by the "light pencil" can be externally projected. In this respect, and as explained, the "image" constitutes transparent sections of the liquid crystal. If a light source such as a tungsten-halogen lamp normally associated with projectors was additionally provided to illuminate the display apparatus from the "rear" thereof in a direction opposing the direction of the incident polarized illumination, such auxillary light source would pass through the display apparatus at the transparent regions, much in the same manner as a photographic slide is projected, the projection image being displayed on a suitable screen. In this instance, of course, a ferroelectric ceramic material that is transparent would be required, such as the material known as PLZT 7/65/35.

As can further be appreciated, the memory characteristics of the optical display of FIG. 28 are not permanent. If domain switching and a permanent memory capability is desired, an alternative electrode configuration would be required in the fashion illustrated in FIG. 30 of the application drawings, components of the apparatus of FIG. 30 that are the same as those of FIG. 28 being represented by the same reference numerals. Specifically, an additional transparent electrode 56 would be disposed between the color switching liquid crystal 46 and the ferroelectric ceramic 52 polarization within the ferroelectric ceramic 52 being effected by the application of a voltage pulse across electrodes 54 and 56, and with an additional grounding electrode 52 being provided on the ceramic 52 as is shown so as to couple one end of the ferroelectric ceramic 52 to the transparent electrode 50.

If a twisted nematic liquid crystal were desired to be utilized in the generalized configuration of the optical display of FIG. 28, a still further modification of the electrode arrangement would be needed and, in this respect, attention is directed to FIG. 29 of the application drawings. Like parts in this FIG. are again represented by the same reference numerals.

Initially, since a twisted nematic liquid crystals alters its light transmissions characteristics by rotating the plane of the polarization of the illumination, a further polarizer such as analyzer 60 is required to be disposed between the ferroelectric ceramic 52 and the liquid crystal 46, the crystal 46 thereby being properly responsive to incoming polarized illumination either provided directly by a polarized source, or provided through the utilization of a non-polarized illumination source in conjunction with a polarizer such as polarizer 34 of the embodiment of FIG. 27. Additionally, a light transmitting electrode 62 would be disposed on the surface of the analyzer 60 immediately adjacent the liquid crystal 46, transparent electrode 62 being coupled through the analyzer and the ferroelectric ceramic substrate 52 to an associated rear electrode 54. Each of the rear electrodes 54 of the array would have associated therewith an additional transparent electrode 62 in similar manner.

If the analyzer 60 was constructed to be crossed with the incoming polarized illumination, the liquid crystal 46 would normally transmit light therethrough and, upon the application of a voltage between electrode 54 and the front transparent electrode 50, would cause the apparatus to provide a so-called "dark spot display." Alternatively, if the incoming polarized light has a plane of polarization parallel to the polarization plane of analyzer 60, a so-called "bright spot display" would result. It should further be appreciated that the embodiment of FIG. 29 can be utilized with a "light pencil" to provide a functional operation similar to that discussed with respect to FIG. 28.

Figure 31:
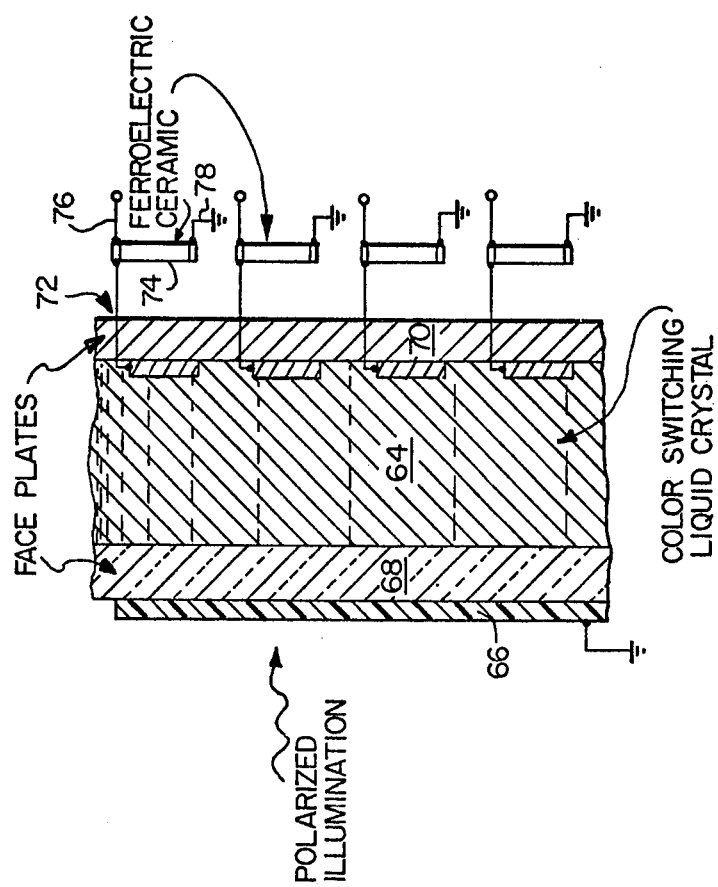
FIG. 31 is a cross-sectional elevational view of a further form of an optical display apparatus constructed in accordance with the teachings of the instant invention, said apparatus utilizing a color switching liquid crystal and further utilizing length-wise polarization of the ceramic substrate.
Figure 30:
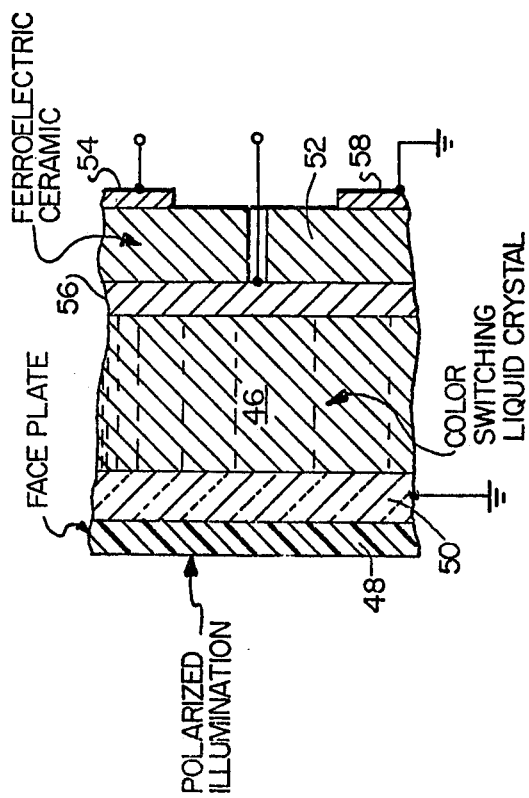
FIG. 30 is a cross-sectional elevational view depicting an optical display apparatus utilizing a color switching liquid crystal in conjunction with a ferroelectric ceramic substrate of the instant invention, and which display apparatus exhibits permanent memory capabilities.

Attention is now directed to FIG. 31 of the application drawings wherein an illustration is provided of an optical display array utilizing a liquid crystal 64 of the color switching type. Each of the units shown is contemplated to represent one of the horizontal row in an overall array. The structure illustrates is in monolithic form and, as shown, constitutes a polarity of superposed layers. Specifically, a transparent electrode 66 is provided, behind which is the liquid crystal 64 disposed between two face plates 68 and 70. A transparent electrode structure 72 is provided imbedded at one end with the liquid crystal 64 and coupled at the other end to one end of the ferroelectric ceramic substrate 74 as is shown. The other end of each ferroelectric ceramic slab 74 is commonly coupled to ground along with the front transparent electrode 66 as was discussed.

With the embodiment of FIG. 31, each ferroelectric ceramic substrate 74 would be initially polarized by the application of a polarizing voltage pulse between the representative terminals or electrodes 76 and 78, for example. Now, upon the application of illumination to the ferroelectric ceramic, a photovoltaic voltage will be generated which appears between the front transparent electrode 66 and the rear transparent electrode 72 causing the liquid crystal 64 between these electrodes to become transparent.

Liquid crystal 64 would normally be in a nominally opaque state. However, sufficient light would be transmitted through the liquid crystal material so as to produce the photovoltage in the ferroelectric ceramic 74, which photovoltage applied to the electrodes 66 and 72 in a positive feed-back arrangement serves to increase the transparency of the color switching liquid crystal 64 in the region between the electrodes. This increased transparency, in turn, increases the voltage output of the ferroelectric material 74 which further increases the transparency of the liquid crystal 64 such that a transparent region would be formed appearing as a bright spot with reflected light. The surface of the ferroelectric ceramic 74 would in this instance serve itself as a diffuse reflector which would be required by a display function in the reflection mode.

Further, it should be appreciated that a certain threshold light transmission of the liquid crystal 64 would be required to begin this process of creating a transparent region. If the liquid crystal is sufficiently thick, the transmitted light through the crystal in its normally opaque state would be insufficient to commence this clearing process and an applied voltage would be initially necessary across the crystal to commence the process, this voltage being used as a "read" signal.

As can be appreciated, the remanent polarization of the ferroelectric ceramic material 74 in the embodiment depicted in FIG. 31 is along the length of the ceramic substrate. An alternate arrangement is possible wherein the memory writing is accomplished by altering the remanent polarization of the ferroelectric ceramic in the thickness direction. In this respect, reference is once again made to FIG. 30 of the application drawings illustrating the disposition of a ferroelectric ceramic 52 in conjunction with the color switching liquid crystal 46 such that the remanent polarization of the ceramic is achieved in the thickness direction, and such that permanent memory characteristics are imparted. With this arrangement, the incident illumination would be quickly absorbed in the surface of the ferroelectric ceramic material but would still penetrate sufficiently so as to produce relatively large photovoltaic voltages.

Figure 32:
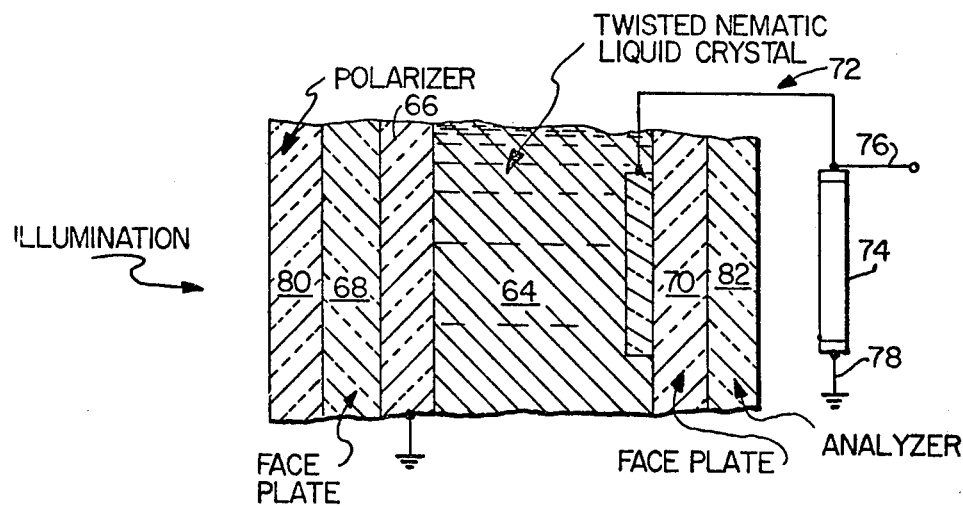
FIG. 32 is an elevational view, in section, of a further form of an optical display apparatus constructed in accordance with the teachings of the instant invention, this apparatus being similar to that depicted in FIG. 31 of the application drawings but utilizing a liquid crystal of the twisted nematic type.

Finally, the optical display device of FIG. 31 can be constructed with a twisted nematic liquid crystal as opposed to the color switching liquid crystal of FIG. 31 and attention is herein directed to FIG. 32 of the application drawings. Again, components of the apparatus of FIG. 32 which are similar to those in FIG. 31 are represented by the same reference numeral.

In this embodiment, a polarizer 80 would initially be provided so as to polarize the incoming illumination. In a fashion similar to the generalized embodiment of FIG. 27, an analyzer 82 would likewise be provided, polarizer 80 and analyzer 82 being assumed to be parallelly disposed. Incoming polarized light will not impinge on the ferroelectric ceramic material 74 because the twisted nematic crystal 64 would rotate the plane of the polarization of the illumination by 90° and such illumination would thus be absorbed in analyzer 82. The display unit, accordingly, would initially be in an "off" or dark state and no voltage would exist across the terminals or electrodes 76 and 78 of the ferroelectric ceramic.

The "on" of the display apparatus would be bright under reflected illumination and would be indicated by the appearance of a DC voltage across terminals 76 and 78. The unit would be switched to the "on" stage through the application of an initial polarizing voltage pulse between electrodes 76 and 78. The twisted nematic liquid crystal would now lose its ability to rotate the plane of polarization of the illumination and light would fall on the surface of the now-polarized ferroelectric ceramic material 74 such that the ceramic would generate a steady, high photovoltaic voltage which would appear across the electrodes of the liquid crystal. This photovoltaic voltage would prevent the liquid crystal from returning to the twisted phase and the liquid crystal would thus remain transparent and a voltage potential would be maintained across the electrodes for the duration of the illumination.

The display apparatus can be returned to its dark state simply by shorting across terminals 76 and 78 and the crystal cell would return to its opaque condition with no voltage appearing across the electrodes. A new external voltage pulse would be required across electrodes 76 and 78 to again switch the unit on. It should be appreciated that only a momentary voltage pulse is required to turn the display unit on, and only a momentary short circuit is needed to turn the unit off.

If the incident illumination were interrupted, the display unit would likewise be put into an "off" state. The memory characteristics of the display apparatus thus are volatile in the sense that a removal of illumination will put the display unit into an "off" state. Permanent memory characteristics can be obtained by depoling the ferroelectric ceramic 74 with additional circuitry and the illumination could then be interrupted. When illumination is restored, a voltage pulse would switch "on" only those units of the array which were in an "on" state at the time of interruption of illumination, since only the polarized ferroelectric ceramic units will produce a photovoltage. The depoled units can then be repoled without switching them "on", utilizing a suitable circuit to apply a polarizing voltage to the ceramic but not to the liquid cell to therefore retain the liquid crystal cell in its dark state as it was at the time the illumination was removed.

Many other different embodiments combining a liquid crystal display with the ferroelectric ceramic substrate of the instant invention can be fabricated along the generalized teachings referred to hereinabove. From the standpoint of materials secltion, PLZT is desired when a transparent ferroelectric ceramic is required, and other ferroelectric ceramics such as $Pb(Zr_{.53} Ti_{.47})O_3 + 1$ wt.% $Nb_2O_5$ (i.e. PZT-5), a solid solution of lead titanate, and lead zirconate can be utilized when relatively cheap "opaque" materials are acceptable. With the display devices as above-discussed, typical thickness of the ferroelectric ceramic material are on the order of 0.020 inches. In accordance with the generalized teachings appearing at the outset of this specification, it is to be appreciated that the photovoltaic output of the ferroelectric ceramic material is proportional to the material length and, the higher the photovoltaic output, the faster the switching time of the associated liquid crystal.

A further form of optical display apparatus is contemplated herein by which the previously discussed photoconductive properties of ferroelectric ceramic materials are utilized in the formation of display apparatus. As will be recalled and appreciated, the resistivity of typical ferroelectric ceramic materials varies as a function of the illumination incident thereon and thus, the voltage drop across illuminated regions of a ferroelectric ceramic substrate that has a polarizing voltage applied thereto would be less than the voltage drop across non-illuminated or dark regions of the ceramic. Attention in this respect is directed to FIG. 33 of the application drawings.

Figures 33, 34:
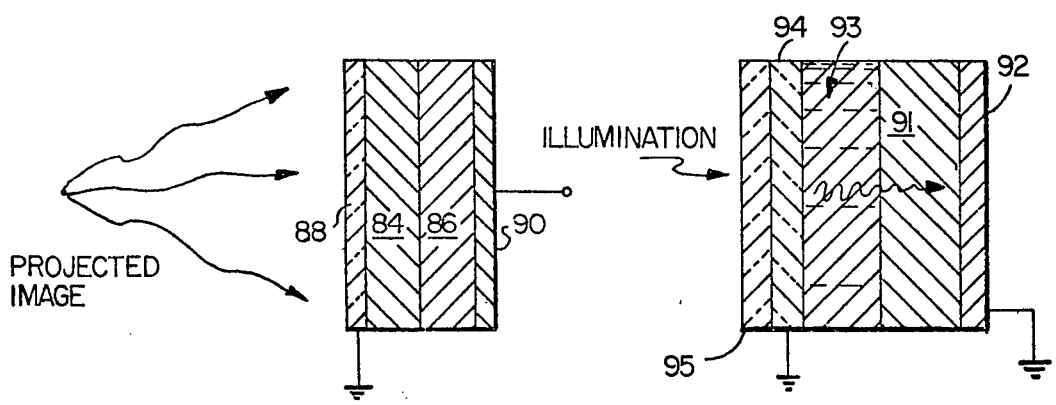
FIG. 33 is a schematic illustration of a further form of optical display and storage utilizing the photoconductive as well as photovoltaic properties of the ferroelectric ceramics.
FIG. 34 illustrates how the image stored in a substrate is displayed.

The display device depicted in FIG. 33 is such that a photograph in the form of a projected image can be stored in a ferroelectric ceramic sheet or substrate 84 as a pattern of poled ferroelectric regions where the remanent polarization of such regions is simply related to the intensity of the projected image at that point. The pattern of poled regions can be produced by the already discussed technique of a photoconductive ferroelectric sandwich, or by utilizing the photoconductive properties of ferroelectric materials directly.

In the embodiment of FIG. 33, an image is projected onto a ferroelectric-photoconductive substrate 84, which substrate is backed by a sheet of resistive material 86 such as evaporated carbon, semiconductor material or the like. A transparent front electrode 88 forming a ground plane covers the surface of the ferroelectric material 84, which material is of the type which would exhibit a sizable polarization dependent photovoltaic effect. A further electrode 90, covers the rear surface of the resistive material 86, and a polarizing voltage would be applied to the apparatus between electrodes 90 and 83.

With such an arrangement the voltage drop will be seen to exist across those regions of the ferroelectric substrate 84 which are illuminated will be less than the voltage drop apparent across the non-illuminated or dark regions. As such the lower remanent polarization within the ferroelectric material will be effected than in those regions of the ferroelectric material that are not illuminated by the projected image. Accordingly a "negative" of THE projected image would thus be stored in the ferroelectric substrate or sheet 84 as regions of varying remanent polarization. In that the ferroelectric 84 is photovoltaic having polarization dependent photovoltages as discussed this stored image is now read ot electrically utilizing the techniques already described with respect to the embodiments of the invention illustrated in FIG. 26 of the application drawings or FIG. 28 et. seq. of the application drawings. It is displayed by applying the photovoltages from regions of polarization in which the image is effectively stored to liquid crystal electrodes as for example is illustrated in FIG. 34 of the application drawings where illumination sufficiently strong penetrates the dark liquid crystal 93, to in a regenerative fashion, apply the photovoltage from polarized region 91, to the liquid crystal region immediately adjacent varying in intensity depending on the value of the polarization. A negative image is produced in reflection.

High Voltage Battery

The teaching herin may be applied toward the provision of a novel high voltage battery serving to convert radiation such as X-radiation in this instance, directly into electrical energy. In this respect, a block or substrate of ferroelectric ceramic material would again be provided to which electrodes are attached in the identical fashion as was discussed with respect to the basic physical configuration of the invention illustrated in FIG. 1 of the application drawings. An example of the constituent material of the ferroelectric ceramic in this instance is solid solution PZT-5A consisting of 53 mole percent $ZrTiO_3$ and 47 mole $PbTiO_3$ with 1 percent by weight niobium added such as $Nb_2O_5$. This ferroelectric ceramic material would be poled in the usual fashion by the application of a high voltage applied across the electrodes.

To function as a battery, the ceramic material can contain a radioactive component and this can be all or a portion of any of the above-discussed constituent elements. For example, the material may be fabricated with a radioactive isotope of Zr,TiO, Nb, etc., or a radioactive additive can be added to the composition. Alternatively, the composition may be placed next to a strong radioactive source and, for example, could actually be coated with a radioactive material. The primary requirement herein is that a flux of gamma rays or X-rays within the material be produced, which radiation has the effect of ionizing the ferroelectric ceramic material so as to produce non-equilibrium carriers.

Thus, in the instance of the application of a poled ferroelectric ceramic material as a high voltage battery, an external light source would not be required as the ionizing source in that the non-equilibrium carriers would be produced by the internal ionizatin of the ferroelectric ceramic material effected by the radiation and would result in an emf which would appear across the electrodes.

Accordingly, an open circuit voltage proportional to the length of the ferroelectric ceramic material between the electrodes and inversely proportional to average grain size, and the like as was discussed at the outset of this specification would be produced by the gamma or X-radiation. Similarly, a short circuit current proportional to the electrode area and the net (steady state) increment of excess carriers introduced into the conduction band would likewise be produced, this being related to the intensity of the ionizing radiation.

As can be appreciated, the emf would persist as long as the ionizing radiation persisted and, extrapolating from the detailed photo-effect results, the emf produced by this high voltage battery would be relatively independent of the intensity of the radiation and thus not strongly dependent on the half-life of the radioactive material.

While there has been shown and described several preferred emdodiments and applications of the basic invention hereof, those skilled in the art should appreciate that such embodiments are exemplary and not limiting and are to be construed within the scope of the following claims:

What is claimed is:

1. A photovoltaic memory apparatus comprising: a substrate of a ferroelectric ceramic; means for selectively applying a voltage pulse of a predetermined polarity across a region of said substrate to thereby effect a remanent ferroelectric polarization in said region of said substrate representative of the information to be stored; means for selectively illuminating said poled region of said substrate with a source of radiation, whereby a photovoltaic voltage is produced at said region of a polairy dependent upon said predetermined polarity of said polarizing voltage pulse; and means for detecting said photovoltaic voltage whereby the stored information is retrieved.

2. A memory apparatus as defined in claim 1, wherein an array of electrode pairs are disposed on opposing sides of said substrate to define a matrix configuration of poled regions, said polarizing voltage pulse being applied across selected electrode pairs, and wherein said information reading means scans said matrix configuration in accordance with a desired pattern, said detecting means being coupled to said array of electrode pairs and being synchronized with said information reading means.

3. A memory apparatus as defined in claim 1, wherein said substrate is sandwiched between at least one electrode pair and one electrode of said electrode pair is transparent such that said illumination from said information reading means passes therethrough into said respective poled region of said substrate.

4. A method of addressing and storing information utilizing a substrate of a ferroelectric ceramic as a memory core, said method comprising the steps of initially effecting a remanent electrical polarization in regions of the ferroelectric ceramic by the application of a voltage pulse across the regions of the substrate, the voltage pulse having at least one of a polarity and magnitude representative of the information to be stored; addressing the memory core while illuminating the polarized regions of the ferroelectric ceramic substrate with a source of radiation; and detecting at least one of the polarity and magnitude of the photovoltaic current and voltage produced by such illumination upon the polarized regions, the polarity and magnitude beng dependent upon the polarity and magnitude of the initial polarizing voltage pulse whereby the stored information is recovered.

5. An optical apparatus comprising in combination: an electro-optic means providing variable light transmission characteristics in response to the magnitude and polarity of an applied voltage; a substrate of a ferroelectric ceramic; means for applying a polarizing voltage pulse of a predetermined magnitude and polarity across said substrate to effect a remanent electrical polarization within said substrate; means for illuminating said electro-optic means and said ceramic substrate, ilumination impinging upon said substrate effecting the generation by said substrate of a photovoltaic current and voltage having a polarity dependent upon the polarity of said polarizing voltage pulse; and means for applying said generated photovoltaic voltage to said electro-optic means, whereby the transmission characteristics of said electro-optic means to the illumination impinging thereon is varied to effect a visual display.

6. A display apparatus as defined in claim 5, wherein the light transmission characteristics of said electro-optic means is switched from a relatively low opacity to a relatively high opacity upon application thereto of said generated photovoltaic voltage.

7. A display apparatus as defined in claim 5, wherein the light transmission characteristics of said electro-optic means is switched from a relatively high opacity to a relatively low opacity upon application thereto of said generated photovoltaic voltage.

8. A display apparatus as defined in claim 6, wherein said relatively low opacity is of a value such that said electro-optic means is substantially transparent, said relatively high opacity being of a value such that said electro-optic means is substantially opaque.

9. A display apparatus as defined in claim 7, wherein said relatively low opacity is of a value such that said electro-optic means is substantially transparent, said relatively high opacity being of a value such that said electro-optic means is substantially opaque.

10. A display apparatus as defined in claim 5, wherein the magnitude of said polarizing voltage is selected such that the light transmission characteristics of said electro-optic means is switched between varying opacities to define a gray scale.

11. A display apparatus as defined in claim 33, wherein said electro-optic means is a liquid crystal of the twisted nematic type.

12. A display apparatus as defined in claim 5, wherein said electro-optic means is a liquid crystal of the color switching type.

13. A display apparatus as defined in claim 11, wherein said liquid crystal is sandwiched between a light polarizer and a light analyzer.

14. A display apparatus as defined in claim 5, wherein said electro-optic means and said ferroelectric ceramic substrate are disposed in superposition to define a monolithic structure.

15. A display apparatus as defined in claim 14, wherein said electro-optic means is a color switching liquid crystal disposed in superposition with said ceramic substrate to define a monolithic structure, and wherein said means for applying a polarizing voltage to said substrate and said means for applying said photovoltaic voltage to said liquid crystal comprises a plurality of electrodes disposed on opposite faces of said structure with said structure being sandwiched therebetween, at least one electrode pair being in contact with said liquid crystal and with said ceramic substrate, respectively; said electrode of said pair which is in contact with said liquid crystal being transparent.

16. A display apparatus as defined in claim 14, wherein said monolithic structure constitutes a plurality of stacked superposed layers comprising a first transparent electrode, an electro-optic means, a second transparent electrode, said substrate of a ferroelectric ceramic, and a third electrode, said third electrode being coupled to said first electrode, said means for applying said polarizing voltage being defined by said second and third electrodes, said means for applying said generated photovoltaic voltage being defined by said first and second electrodes, and wherein said means for illuminating said electro-optic means and said substrate comprises a light beam directed to impinge upon said first transparent electrode.

17. A display apparatus as defined in claim 16, wherein said electro-optic means is a liquid crystal of the color switching type.

18. A display apparatus as defined in claim 16, wherein said plurality of stacked layers futher includes a polarizer disposed over said first transparent electrode, and an analyzer disposed between said second transparent electrode and said ceramic substrate, said electro-optic means being a liquid crystal of the twisted nematic type.

19. A display apparatus as defined in claim 16, wherein said illumination means comprises a source of polarized light, said plurality of stacked layers including an analyzer disposed between said second transparent electrode and said ceramic substrate, said electro-optic means being a liquid crystal of the twisted nematic type.

20. A display apparatus as defined in claim 19, wherein said analyzer is disposed in a direction parallel to the plane of polarization of the incident illumination.

21. A display apparatus as defined in claim 19, wherein said analyzer is disposed so as to be crossed with respect to the plane of polarization of the incident illumination.

22. A method of electrically storing optical information comprising the steps of: projecting an image constituting the optical information onto a sandwich of a ferroelectric ceramic backed by a layer of resistive material to form an illumination pattern thereon; applying a voltage pulse across the sandwich whereby varying remanent polarizations within the ferroelectric ceramic are produced in dependence upon the illumination pattern.

23. The method of claim 22, further including the step of readingout the remanent polarizations to thereby extract the stored optical information.

24. A display apparatus as defined in claim 5, wherein said variation of the transmission characteristics of the electro-optic means ensures that illumination continues to impinge upon said substrate to latch said electro-optical means and maintain said transmission variation thereof.

25. A method of electrically storing optical information comprising the steps of: projecting an image constituting the optical information onto a ferroelectric ceramic layer to form an illumination pattern thereon and thereby alter the resistivity of the ceramic layer in accordance with said pattern; applying a voltage pulse across the ceramic whereby varying remanent polarizations within the ferroelectric ceramic are produced in dependence upon the illumination pattern.

* * * * *